(12) United States Patent
Wei et al.

(10) Patent No.: US 9,829,521 B2
(45) Date of Patent: Nov. 28, 2017

(54) ESTIMATION METHOD, ESTIMATION DEVICE, AND INSPECTION DEVICE FOR VARIABLE RESISTANCE ELEMENT, AND NONVOLATILE MEMORY DEVICE

(71) Applicant: Panasonic Corporation, Osaka (JP)

(72) Inventors: Zhiqiang Wei, Osaka (JP); Takeki Ninomiya, Osaka (JP); Shunsaku Muraoka, Osaka (JP); Takeshi Takagi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 761 days.

(21) Appl. No.: 14/218,056

(22) Filed: Mar. 18, 2014

(65) Prior Publication Data

US 2014/0278160 A1 Sep. 18, 2014

(30) Foreign Application Priority Data

Mar. 18, 2013 (JP) .................................. 2013-055619
Mar. 18, 2013 (JP) .................................. 2013-055696
Mar. 11, 2014 (JP) .................................. 2014-047110

(51) Int. Cl.
*G01R 31/00* (2006.01)
*G11C 11/00* (2006.01)
(Continued)

(52) U.S. Cl.
CPC .......... *G01R 27/02* (2013.01); *G11C 13/0002* (2013.01); *G11C 13/004* (2013.01);
(Continued)

(58) Field of Classification Search
CPC . G11C 13/00; G11C 13/0069; G11C 13/0002; G11C 13/0007; G11C 13/004
(Continued)

(56) References Cited

U.S. PATENT DOCUMENTS 6,473,332 B1 10/2002 Ignatiev et al.
7,894,253 B2 2/2011 Kreupl et al.
(Continued)

FOREIGN PATENT DOCUMENTS

JP 2006-60120 3/2006
JP 2008-153624 7/2008
(Continued)

OTHER PUBLICATIONS

Rainer Waser et al., "Redox-Based Resistive Switching Memories—Nanoionic Mechanisms, Prospects, and Challenges", Advanced Materials, vol. 21, p. 2632-2663, Jul. 2009.
(Continued)

*Primary Examiner* — An Do
(74) *Attorney, Agent, or Firm* — Wenderoth, Lind & Ponack, L.L.P.

(57) ABSTRACT

An estimation method for a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation method including: obtaining, when changes are made to the resistive status of the local region, measurement values each indicating a resistance state after one of the changes; and determining, based on a distribution of the obtained measurement values, an estimated amount of a physical parameter regarding structural characteristics of the local region by a calculation.

24 Claims, 23 Drawing Sheets

(51) Int. Cl.
    *G01R 27/02*     (2006.01)
    *G11C 13/00*     (2006.01)
    *G11C 29/50*     (2006.01)

(52) U.S. Cl.
    CPC ...... *G11C 13/0007* (2013.01); *G11C 13/0069* (2013.01); *G11C 29/50* (2013.01); *G11C 13/00* (2013.01); *G11C 2013/0073* (2013.01); *G11C 2029/5002* (2013.01)

(58) Field of Classification Search
    USPC ............... 702/58, 65; 365/148, 158, 163
    See application file for complete search history.

(56) References Cited

U.S. PATENT DOCUMENTS

| | | | |
|---|---|---|---|
| 8,054,674 B2 | 11/2011 | Tamai et al. | |
| 8,395,925 B2 * | 3/2013 | Kawai | G11C 13/0007 365/148 |
| 8,625,328 B2 * | 1/2014 | Tomotani | H01L 49/00 365/148 |
| 8,787,070 B2 * | 7/2014 | Shimakawa | G11C 13/004 365/148 |
| 8,867,259 B2 | 10/2014 | Kawai et al. | |
| 2008/0099752 A1 | 5/2008 | Kreupl et al. | |
| 2008/0102278 A1 | 5/2008 | Kreupl et al. | |
| 2010/0172170 A1 | 7/2010 | Tamai et al. | |
| 2012/0120712 A1 | 5/2012 | Kawai et al. | |
| 2012/0230085 A1 | 9/2012 | Kawai et al. | |
| 2013/0064002 A1 | 3/2013 | Terai | |
| 2013/0148408 A1 | 6/2013 | Kawai et al. | |
| 2013/0295745 A1 | 11/2013 | Takahashi et al. | |

FOREIGN PATENT DOCUMENTS

| | | |
|---|---|---|
| JP | 2008-235704 | 10/2008 |
| JP | 2008-306157 | 12/2008 |
| JP | 2013-48004 | 3/2013 |
| JP | 2013-62401 | 4/2013 |
| WO | 2008/142919 | 11/2008 |
| WO | 2009/145308 | 12/2009 |
| WO | 2010/143396 | 12/2010 |
| WO | 2012/042866 | 4/2012 |
| WO | 2012/120893 | 9/2012 |
| WO | 2013/021648 | 2/2013 |

OTHER PUBLICATIONS

Yakov M. Strelniker et.al., "Resistance distribution in the hopping percolation model", Physical Review E 72, 016121, Jul. 2005, pp. 016121-1-016121-5.

Ximeng Guan et al., "On the Switching Parameter Variation of Metal-Oxide RRAM Part I: Physical Modeling and Simulation Methodology", IEEE Transactions on Electron Devices, Vol. 59, No. 4, April 2012, pp. 1172-1182.

Alexander Makarov et al., "Stochastic modeling of bipolar resistive switching in metal-oxide based memory by Monte Carlo technique", J Comput Electron, Oct. 7, 2010, pp. 146-152.

* cited by examiner

Length of local region  l = 6.5 nm
Area of local region  S = 136
Packing density of defects
$\begin{cases} pLR = 0.107 \text{ (Low resistance state)} \\ pHR = 0.00132 \text{ (High resistance state)} \end{cases}$ Length of local region  l = 6.5 nm
Area of local region  S = 175
Packing density of defects
$\begin{cases} pLR = 0.166 \text{ (Low resistance state)} \\ pHR = 0.00206 \text{ (High resistance state)} \end{cases}$

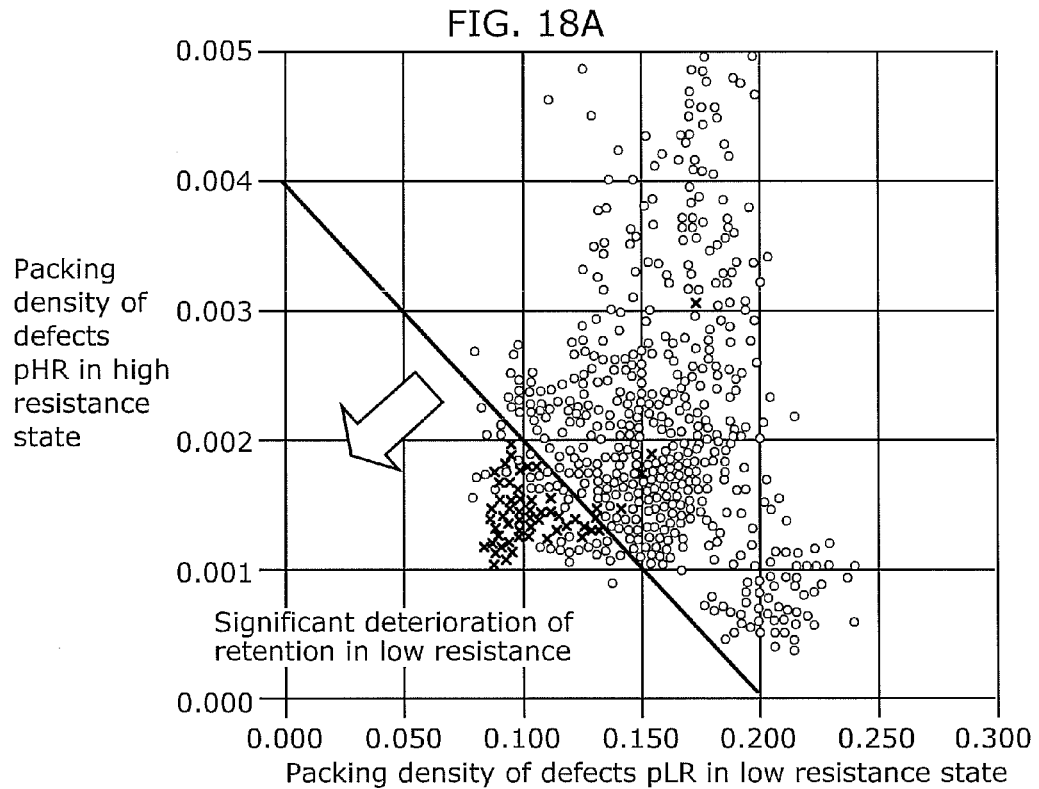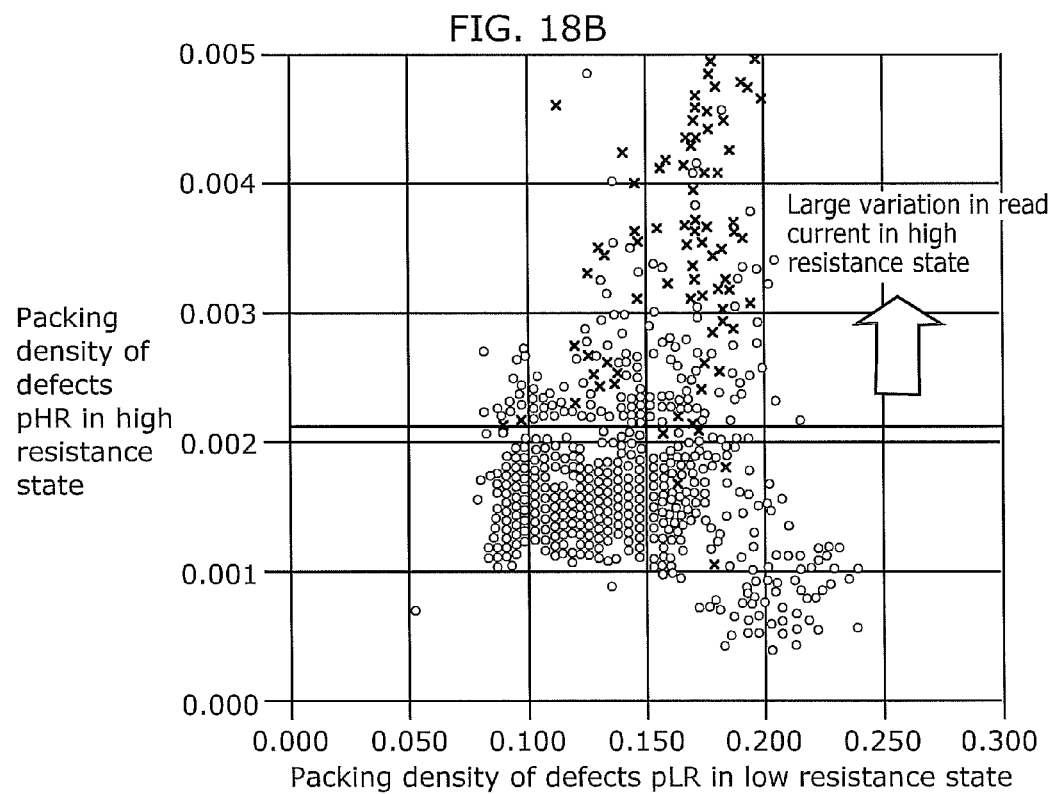

ESTIMATION METHOD, ESTIMATION DEVICE, AND INSPECTION DEVICE FOR VARIABLE RESISTANCE ELEMENT, AND NONVOLATILE MEMORY DEVICE

CROSS REFERENCE TO RELATED APPLICATIONS

The present application is based on and claims priority of Japanese Patent Application No. 2013-055619 filed on Mar. 18, 2013, Japanese Patent Application No. 2013-055696 filed on Mar. 18, 2013, and Japanese Patent Application No. 2014-047110 filed on Mar. 11, 2014. The entire disclosure of the above-identified applications, including the specifications, drawings and claims is incorporated herein by reference in its entirety.

FIELD

One or more exemplary embodiments disclosed herein relate generally to an estimation method, an estimation device, an inspection device for a variable resistance element having resistive status that reversibly changes according to an applied electric pulse, and to a nonvolatile memory device.

BACKGROUND

Recent years have seen increase in amount of data in data of music, pictures, information, or the like along with progress of digital technology for electric appliances. Demands for large-capacity memory devices are increasing to store data having a great amount of data.

Examples of a large-capacity memory device include a variable resistance nonvolatile memory device. The variable resistance nonvolatile memory device is a memory device which uses for a memory cell a variable resistance element with resistive status that reversibly changes between a high resistance state and a low resistance state according to an applied electric pulse and retains the resistance state.

A typical variable resistance element has a relatively simple element structure including a first electrode, a second electrode, and a variable resistance layer which is positioned between the first electrode and the second electrode and has resistive status that reversibly changes according to an electric pulse applied between the first electrode and the second electrode (see patent literature (PTL) 1 and PTL 2, for example).

Furthermore, the variable resistance element has been attracting attention not only because of its relatively simple element structure but also because it is easy to increase its density and to ensure consistency with a conventional semiconductor process.

Such variable resistance elements are divided into two general types according to variable resistance materials that are materials for variable resistance layers.

A variable resistance element of one type includes, as a variable resistance material, a material having a perovskite crystal structure (e.g., $Pr_{1-x}Ca_xMnO_3$ (PCMO), $La_{1-x}Sr_x$-$MnO_3$ (LSMO), or $GdBaCo_xO_y$ (GBCO)) disclosed in PTL 1 and so on.

Furthermore, a variable resistance element of the other type includes a binary metal oxide as a variable resistance material. Compared to the material having a perovskite crystal structure, composition and structure of binary metal oxides are so simple that composition control and film formation in manufacturing can be easily performed. Furthermore, binary transition metal oxides advantageously have rather favorable consistency with semiconductor manufacturing processes, and thus there has been considerable research on binary metal oxides.

According to recent studies on mechanism of resistance change in a binary metal oxide, some researchers believe that a likely cause of such resistance change is deposition and dissolution of conductive filaments in the metal oxide (see PTL 2 and Non Patent Literature (NPL) 1, for example).

CITATION LIST

Patent Literature

[PTL 1] U.S. Pat. No. 6,473,332
[PTL 2] Japanese Unexamined Patent Application Publication No. 2008-306157

Non Patent Literature

[NPL 1] R. Waser et al., Advanced Materials, NO21, 2009, pp. 2632-2663

SUMMARY

Technical Problem

It is important for the above-described variable resistance element to quantitatively ascertain resistance change characteristics of the variable resistance element to control, for example, quality or reliability of the variable resistance element and a product which includes the variable resistance element.

One non-limiting and exemplary embodiment provides (i) an estimation method, an estimation device, an inspection device for a variable resistance element and (ii) a nonvolatile memory device, which are suitable for quantitatively ascertaining resistance change characteristics and are novel.

Solution to Problem

In one general aspect, the techniques disclosed here feature an estimation method for a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation method including: obtaining, when changes are made to the resistive status of the local region, measurement values each indicating a resistance state after one of the changes; and determining, based on a distribution of the obtained measurement values, an estimated amount of a physical parameter regarding structural characteristics of the local region by a calculation.

Furthermore, in one general aspect, the techniques disclosed here feature an estimation method for a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation method including: obtaining an estimated amount of a physical parameter regarding structural characteristics of the local region; and judging whether the variable resistance element is non-defective or defective based on whether or not the obtained estimated amount of the physical parameter satisfies a predetermined condition.

Note that these general or specific aspects may be implemented using the estimation device, the inspection device, or the nonvolatile memory device or may be implemented using any combination of the estimation device, the inspection device, and the nonvolatile memory device.

Additional benefits and advantages of the disclosed embodiments will be apparent from the description and drawings. The benefits and/or advantages may be individually obtained by the various embodiments and features of the description and drawings, which need not all be provided in order to obtain one or more of such benefits and/or advantages.

Advantageous Effects

One or more exemplary embodiments or features disclosed herein make it possible to quantitatively ascertain resistance change characteristics of a variable resistance element.

BRIEF DESCRIPTION OF DRAWINGS

These and other advantages and features will become apparent from the following description thereof taken in conjunction with the accompanying drawings, by way of non-limiting examples of embodiments disclosed herein.

FIG. 5A is a diagram showing an example of a percolation model indicating a filament formed in the local region.

FIG. 5B is a diagram showing an example of the percolation model indicating filaments formed in the local region.

FIG. 5C is a diagram showing an example of the percolation model indicating a filament formed in the local region.

FIG. 18A is a scattering chart showing an example of dependency of a retention deterioration rate of a variable resistance element in a low resistance state on a packing density of defects in a low resistance state and a packing density of defects in a high resistance state.

FIG. 18B is a scattering chart showing an example of dependency of a range of read current of the variable resistance element in a high resistance state on a packing density of defects in a low resistance state and a packing density of defects in a high resistance state.

DESCRIPTION OF EMBODIMENTS

1. Circumstances Behind Creation of Present Disclosure

Circumstances behind creation of the present disclosure are described before describing embodiments of the present disclosure.

Figure 26:
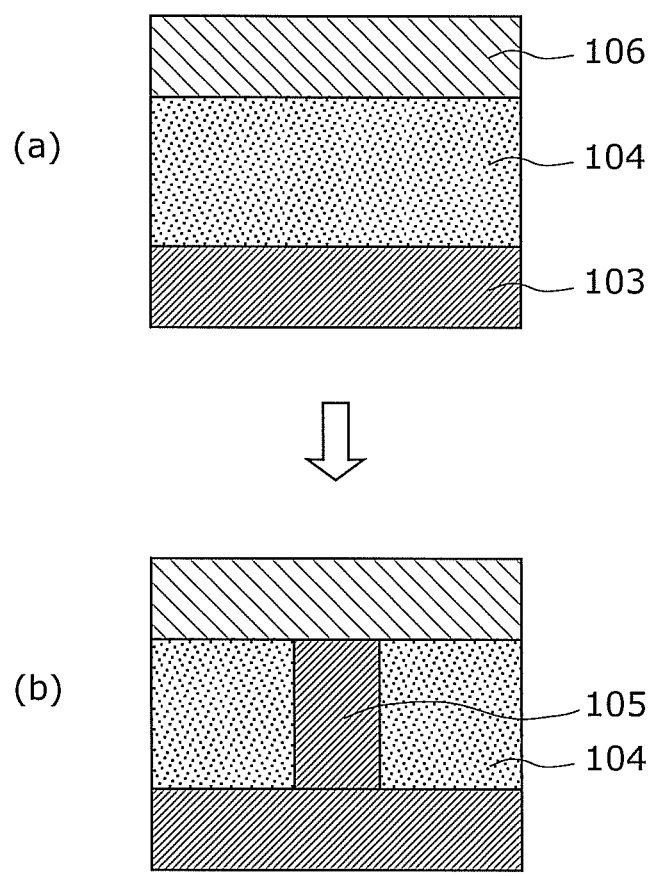
FIG. 26 show cross-sectional views of an example of the structure of a variable resistance element before and after an application of an initial breakdown voltage.

FIG. 26 is a cross-sectional view schematically showing an example of the structure of a variable resistance element.

(a) in FIG. 26 shows a structure of a variable resistance element 900 in an initial state after being manufactured. The variable resistance element 900 in the initial state includes a first electrode 103, a second electrode 106, and a variable resistance layer 104 which is positioned between the first electrode 103 and the second electrode 106 and comprises a metal oxide. The variable resistance layer 104 included in the variable resistance element 900 in the initial state is in a state where a resistance change material is merely deposited, and has a resistance value considerably high compared to a resistance value of a normal high resistance state. Thus, the resistance value of the variable resistance element 900 in the initial state does not change in response to an application of a normal programming voltage.

(b) in FIG. 26 shows structure of the variable resistance element 900 in an operatable state. The resistance value of the variable resistance element 900 in the operatable state reversibly changes between a high resistance state and a low resistance state in response to an application of a normal programming voltage.

The variable resistance element 900 in the initial state is changed into the operatable state with, for example, an application of an initial breakdown voltage higher than a normal programming voltage after manufacturing. The operation to cause the variable resistance element to be in the operatable state with an application of the initial breakdown voltage is called an initial breakdown operation.

In the variable resistance layer 104 of the variable resistance element 900 in an operatable state, a local region 105 is formed.

The local region 105 is a part of the variable resistance layer 104 in which a current dominantly flows when a voltage is applied between the first electrode 103 and the second electrode 106. Assuming that current flows through a series of oxygen defects that is a filament present in the variable resistance layer 104, the local region 105 can be referred to as a region which has a higher packing density of defects and in which the filament is more likely to be formed compared to another part of the variable resistance layer 104.

As mentioned in the Background section, some researchers believe that the resistance change of the variable resistance element occurs due to deposition and dissolution of the filament.

In view of this, the inventors of the present application believe that the deposition and dissolution of the filament occurs in the above-described local region, and pay attention to the possibility that resistance change characteristics of the variable resistance element can be quantitatively ascertained based on structural characteristics (e.g., a dimension, and a packing density of defects) of the local region.

For example, it is empirically known that repeated operations of high resistance programming and low resistance programming on a plurality of variable resistance elements cause some variable resistance elements to have increased range of resistance values or have inferior retention characteristics.

However, such variable resistance elements with a latent failure often show substantially the same resistance values and read current values as other variable resistance elements in an initial stage. Thus, direct use of resistance values and current values is not so effective in screening such variable resistance elements before the failure becomes apparent.

For this, it is possible that the structural characteristics of the local region reflects such latent failure that is, in other words, reliability of the variable resistance element concerning the resistance changing operations in the future.

The inventors conducted dedicated studies based on the above speculation, and found a novel estimation method for the variable resistance element suitable for quantitatively ascertain the resistance change characteristics.

Note that, the above description is intended as an aid in understanding embodiments described below and does not limit the present disclosure.

2. Outline of Embodiments

According to an exemplary embodiment disclosed herein, an estimation method is an estimation method for a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation method including: obtaining, when changes are made to the resistive status of the local region, measurement values each indicating a resistance state after one of the changes; and determining, based on a distribution of the obtained measurement values, an estimated amount of a physical parameter regarding structural characteristics of the local region by a calculation.

With this method, the measurement values are obtained in a state where resistive status of the local region can be changed a plurality of times, that is, without destroying the variable resistance element. The measurement values may be, for example, resistance values or current values that can be electrically measured. Thus, even after the variable resistance element is incorporated into a product such as the nonvolatile memory device or the like, the estimated amount can be determined in a state where the variable resistance element is incorporated in the product, without destroying the variable resistance element and without preparing a special sample of a variable resistance element for estimation.

Judging whether the variable resistance element is non-defective or defective using the determined estimated amount, and screening the variable resistance element determined to be defective make it possible to improve a yield and reliability of a product which includes the variable resistance element.

Furthermore, for example, in the determining, (i) a theoretical distribution which is a distribution of resistance states theoretically derived from a model of the local region having a reference amount of the physical parameter and (ii) a measured distribution which is a distribution of the resistance states indicated by the obtained measurement values may be compared and, when the theoretical distribution and the measured distribution match to a predetermined degree, the estimated amount of the physical parameter may be determined to be the reference amount.

Such a method makes it possible to determine whether the estimated amount is the reference amount, based on a comparison between the theoretical distribution and the measured distribution.

Furthermore, for example, in the determining, (i) theoretical distributions of resistance states each theoretically derived from the model of the local region for one of different reference amounts of the physical parameter and (ii) the measured distribution may be compared, and the estimated amount of the physical parameter may be determined to be one of the reference amounts for which the theoretical distribution that matches with the measured distribution to a highest degree is derived.

With this method, it is possible to determine the most appropriate reference amount among the reference amounts to be the estimated amount, based on the comparison between the measured distribution and a plurality of the theoretical distributions.

Furthermore, for example, it may be that the local region comprises a metal oxide, the reference amount indicates a dimension and a packing density of defects concerning a deficiency of oxygen, the dimension and the packing density of defects each being the physical parameter of the local region, and the model represents a three-dimensional region having a dimension indicated by the reference amount and is divided into a plurality of portions each representing an oxygen site, the estimation method further including deriving the theoretical distribution, the deriving including: performing simulations in each of which hopping sites created by deficiency of oxygen are randomly allocated to the number of sites, among the sites of the model, which corresponds to the packing density of defects indicated by the reference amount; calculating, in each of the simulations, a theoretical resistance value of the variable resistance element as a whole, based on a formation state of a filament composed of the hopping sites that extends from a portion closest to the first electrode and a peripheral portion of the first electrode to a portion in contact with the second electrode in the local region; and deriving, as the theoretical distribution, a distribution of the calculated resistance values.

With this method, the theoretical distribution which is compared with the measured distribution can be derived by simulation.

Furthermore, for example, in the deriving, the theoretical distribution may be derived from the model of the local region for each of different reference amounts of the physical parameter, the estimation method may further include storing the derived theoretical distributions, and in the determining, the estimated amount of the physical parameter may be determined by comparing the theoretical distributions stored in the storing and the measured distribution.

With this method, the theoretical distributions can be derived and stored in advance, and the theoretical distributions can be compared with the measured distribution.

Furthermore, for example, in the determining, (i) a representative value which is an intermediate value of the obtained measurement values and (ii) an amount of variation of the obtained measurement values may be calculated, and the estimated amount of the physical parameter may be determined to be an amount obtained by substituting the calculated representative value and the calculated amount of variation into an estimation expression.

With this method, the estimated amount can be determined by substituting the representative value and the amount of variation, which are obtained from the measured distribution, into the estimation expression.

Furthermore, for example, it may be that the physical parameter is an area of the local region, the estimation expression includes (i) a term in which the representative value is multiplied by the amount of variation or (ii) a term in which a square of the amount of variation is divided by the representative value, and in the determining, the estimated amount of the area of the local region is determined by (i) multiplying the representative value by the amount of variation or (ii) dividing a square of the amount of variation by the representative value, according to the estimation expression.

With this method, the area of the local region can be determined according to the estimation expression.

Furthermore, for example, it may be that the physical parameter is a packing density of defects in the local region, the estimation expression includes a term in which the representative value is divided by the amount of variation, and in the determining, the estimated amount of the packing density of defects in the local region is determined by dividing the representative value by the amount of variation, according to the estimation expression.

With this method, the packing density of defects in the local region can be determined according to the estimation expression.

Furthermore, for example, in the determining, a mean or a median of the measurement values may be calculated as the representative value.

With this method, the mean or the median of the measurement values can be used as the representative value.

Furthermore, for example, the estimation method may further include: making changes to the resistive status of the local region; and measuring the resistive status of the variable resistance element after each of the changes, to acquire measurement values, wherein in the obtaining, the measurement values acquired in the measuring are obtained.

With this method, changes can be made to the resistive status of the variable resistance element and the resistive status can be measured in the estimation method.

Furthermore, for example, the estimation method may further include: judging whether the variable resistance element is non-defective or defective based on whether or not the estimated amount of the physical parameter determined in the determining satisfies a predetermined condition.

With this method, it is possible to judge whether the variable resistance element is non-defective or defective based on the determined estimated amount.

Furthermore, for example, the estimation method may further include: excluding the variable resistance element from use, when the variable resistance element is judged to be defective in the judging.

With this method, a defective variable resistance element is excluded from use. Thus, a yield and reliability of a product which includes the variable resistance element can be improved.

Furthermore, for example, the estimation method may further include: modifying the variable resistance element, when the variable resistance element is judged to be defective in the judging.

With this method, a defective variable resistance element is modified. Thus, a yield and reliability of a product which includes the variable resistance element can be improved.

According to an exemplary embodiment disclosed herein, an estimation method is an estimation method for a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation method including: obtaining an estimated amount of a physical parameter regarding structural characteristics of the local region; and judging whether the variable resistance element is non-defective or defective based on whether or not the obtained estimated amount of the physical parameter satisfies a predetermined condition.

With this method, whether the variable resistance element is non-defective or defective is judged based on the estimated amount of the physical parameter regarding the structural characteristics of the local region. Thus, future reliability of the variable resistance element can be predicted and, as a result, the variable resistance element can be screened before failure becomes noticeable.

According to an exemplary embodiment disclosed herein, an estimation device is an estimation device which performs estimation of a variable resistance element including (i) a first electrode, (ii) a second electrode, and therebetween (iii) a variable resistance layer in which a local region is formed which has resistive status that reversibly changes according to an electric pulse applied between the first electrode and the second electrode, the estimation device including: an obtainment unit configured to obtain, when changes are made to the resistive status of the local region, measurement values each indicating a resistance state after one of the changes; and a determination unit configured to determine, based on a distribution of the obtained measurement values, an estimated amount of a physical parameter regarding structural characteristics of the local region by a calculation.

With this structure, the measurement values are obtained in a state where resistive status of the local region can be changed a plurality of times, that is, without destroying the variable resistance element. The measurement values may be, for example, resistance values or current values that can be electrically measured. Thus, even after the variable resistance element is incorporated into a product such as the nonvolatile memory device or the like, the estimated amount can be determined in a state where the variable resistance element is incorporated in the product, without destroying the variable resistance element and without preparing a special sample of a variable resistance element for estimation.

Furthermore, for example, the determination unit may be configured to compare (i) a theoretical distribution which is a distribution of resistance states theoretically derived from a model of the local region having a reference amount of the physical parameter and (ii) a measured distribution which is a distribution of the resistance states indicated by the obtained measurement values and, when the theoretical distribution and the measured distribution match to a predetermined degree, determine that the estimated amount of the physical parameter is the reference amount.

Furthermore, for example, the estimation device may further include a storage unit configured to store theoretical distributions of resistance states each theoretically derived from the model of the local region for one of different reference amounts of the physical parameter, wherein the determination unit may be configured to determine the estimated amount of the physical parameter by comparing the theoretical distributions stored in the storage unit and the measured distribution.

Furthermore, for example, the determination unit may be configured to calculate (i) a representative value which is an intermediate value of the obtained measurement values and (ii) an amount of variation of the obtained measurement values, and determine that the estimated amount of the physical parameter is an amount obtained by substituting the calculated representative value and the calculated amount of variation into an estimation expression.

Furthermore, for example, the estimation device may further include a judgment unit configured to judge whether the variable resistance element is non-defective or defective based on whether or not the estimated amount of the physical parameter determined by the determination unit satisfies a predetermined condition.

With these structures, estimation devices capable of producing advantageous effects similar to the advantageous effects described for the estimation method can be obtained.

According to an exemplary embodiment disclosed herein, an inspection device is an inspection device for inspecting a variable resistance element including (i) a first electrode, (ii) a second electrode, and therebetween (iii) a variable resistance layer in which a local region is formed which has resistive status that reversibly changes according to an electric pulse applied between the first electrode and the second electrode, the inspection device including the above-described estimation device, the inspection device judging, using the estimation device, whether the variable resistance element is non-defective or defective, and excluding the variable resistance element from use when the variable resistance element is judged to be defective.

According to an exemplary embodiment disclosed herein, an inspection device is an inspection device for inspecting a variable resistance element including (i) a first electrode, (ii) a second electrode, and therebetween (iii) a variable resistance layer in which a local region is formed which has resistive status that reversibly changes according to an electric pulse applied between the first electrode and the second electrode, the inspection device including the above-described estimation device, the inspection device judging, using the estimation device, whether the variable resistance element is non-defective or defective, and modifying the variable resistance element when the variable resistance element is judged to be defective.

With these structures, inspection devices capable of producing advantageous effects similar to the advantageous effects described for the estimation method can be obtained.

According to an exemplary embodiment disclosed herein, a nonvolatile memory device includes: a variable resistance element including (i) a first electrode, (ii) a second electrode, and therebetween (iii) a variable resistance layer in which a local region is formed which has resistive status that reversibly changes according to an electric pulse applied between the first electrode and the second electrode; a programming circuit which applies an electric pulse to the variable resistance element for changing resistive status of the local region; a read circuit which obtains a measurement value indicating a resistance state of the variable resistance element; and an inspection circuit which (i) makes changes to the resistive status of the local region by using the programming circuit, (ii) obtains measurement values each indicating a resistance state after one of the changes by using the read circuit, and (iii) determines, based on a distribution of the obtained measurement values, an estimated amount of a physical parameter regarding structural characteristics of the local region by a calculation.

Furthermore, for example, the above-described nonvolatile memory device may further include a redundant variable resistance element having a structure identical with a structure of the variable resistance element, wherein the inspection circuit may judge whether the variable resistance element is non-defective or defective based on whether or not the determined estimated amount of the physical parameter satisfies a predetermined condition, and may replace the variable resistance element with the redundant variable resistance element when the variable resistance element is judged to be defective.

Furthermore, for example, the inspection circuit may judge whether the variable resistance element is non-defective or defective based on whether or not the determined estimated amount of the physical parameter satisfies a predetermined condition, and may perform an initial breakdown of the variable resistance element by using the programming circuit when the variable resistance element is judged to be defective.

With these structures, nonvolatile memory devices capable of producing advantageous effects similar to the advantageous effects described for the estimation method can be obtained.

Hereinafter, certain exemplary embodiments are described in greater detail with reference to the accompanying drawings. Note that, each of the drawings is a schematic diagram for an explanatory purpose. Thicknesses and ratios of sizes among portions in the drawings are not necessarily strictly accurate.

It should be noted that elements having substantially the same structures, functions, and effects are denoted with the same reference signs in the drawings.

Furthermore, each of the exemplary embodiments described below shows a general or specific example. The structural elements, the arrangement and connection of the structural elements, steps, the processing order of the steps, numerical values, materials, etc. in the following exemplary embodiments are mere examples, and therefore do not limit the scope of the appended Claims and their equivalents. Thus, among the structural elements in the following exemplary embodiments, structural elements not recited in any one of the independent claims are described as arbitrary structural elements.

3. Variable Resistance Element to be Estimated

For preparation, description is provided on the variable resistance element which is evaluated according to estimation methods according to embodiments that will be described later.

Figure 1:
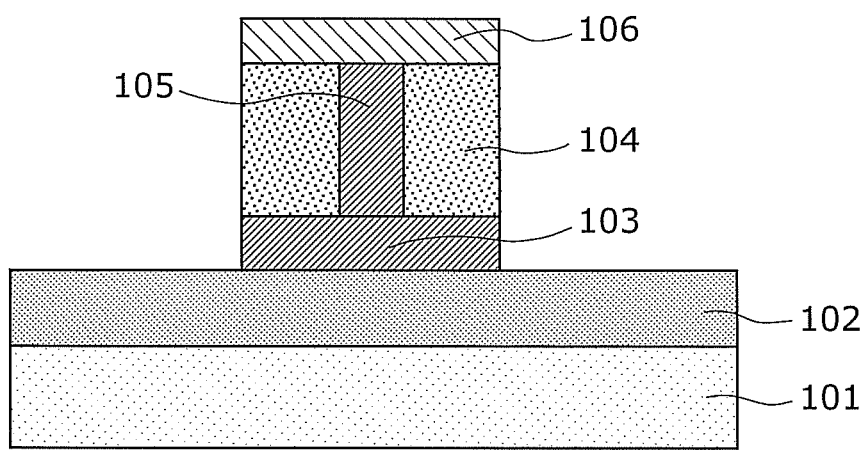
FIG. 1 is a cross-sectional diagram showing an example of the structure of a variable resistance element to be estimated with estimation methods according to embodiments.

FIG. 1 is a cross-sectional diagram showing an example of the structure of a variable resistance element to be estimated.

A variable resistance element 100 is an element which has resistive status that reversibly changes between a high resistance state and a low resistance state according to an applied electric pulse, and retains the resistance state. As shown in FIG. 1, the variable resistance element 100 includes: a substrate 101; an interlayer insulating film 102 formed on the substrate 101; a first electrode 103 formed on the interlayer insulating film 102; a variable resistance layer 104 formed on the first electrode 103; and a second electrode 106. The local region 105 is formed in the variable resistance element 104.

The substrate 101 may be, for example, a silicon single crystal substrate or a semiconductor substrate. Note that, the substrate 101 is not limited to the silicon single crystal substrate or the semiconductor substrate. The variable resistance layer 104 can be formed on a substrate at a relatively low temperature. Thus, the substrate 101 may comprise, for example, a resin material.

The first electrode 103 may comprise a material having a lower standard electrode potential, such as tungsten (W), nickel (Ni), tantalum (Ta), titanium (Ti), aluminum (Al), tantalum nitride (TaN), titanium nitride (TiN), or the like, compared to the metal included in the variable resistance layer 104. Furthermore, the second electrode 106 may comprise a material having a higher standard electrode potential, such as platinum (Pt), iridium (Ir), palladium (Pd), or the like, compared to a metal included in the variable resistance layer 104 and a material included in the first electrode 103. The higher the standard electrode potential of a material is, the more difficult it is to oxidize the material.

The variable resistance layer 104 is a layer having resistive status that reversibly changes between a high resistance state and a low resistance state based on a polarity of a voltage applied between the first electrode 103 and the second electrode 106. The variable resistance layer 104 comprises an oxygen-deficient metal oxide. The oxygen-deficient metal oxide refers to a metal oxide having a lower oxygen content atomic percentage (atomic proportion, the ratio of the number of oxygen atoms to the total number of atoms) than the composition of the metal oxide of stoichiometric composition (this is typically an insulator). The metal in the metal oxide is selected, for example, at least one from aluminum (Al) or a transition metal such as tantalum (Ta), hafnium (Hf), titanium (Ti), tungsten (W), nickel (Ni), iron (Fe), or the like.

The local region 105 is a part of the variable resistance layer 104 and is a region where a current dominantly flows when a voltage is applied between the first electrode 103 and the second electrode 106, and an arbitrary number of filaments in arbitrary shapes can be formed in the local region 105.

Note that, it may be that the local region 105 is not in contact with the first electrode 103 and is in contact with the second electrode 106. With such a structure, the first electrode 103 does not contribute to a resistance change and thus can increase the degree of freedom with respect to the selection of a material included in the first electrode 103. The first electrode 103 and the second electrode 106 may comprise the same material. Generating the first electrode 103 and the second electrode 106 under the same processing condition makes it possible to simplify processing.

Such a structure can be applied to a variable resistance element in which, for example, the variable resistance layer 104 has a stacked structure.

Figure 2:
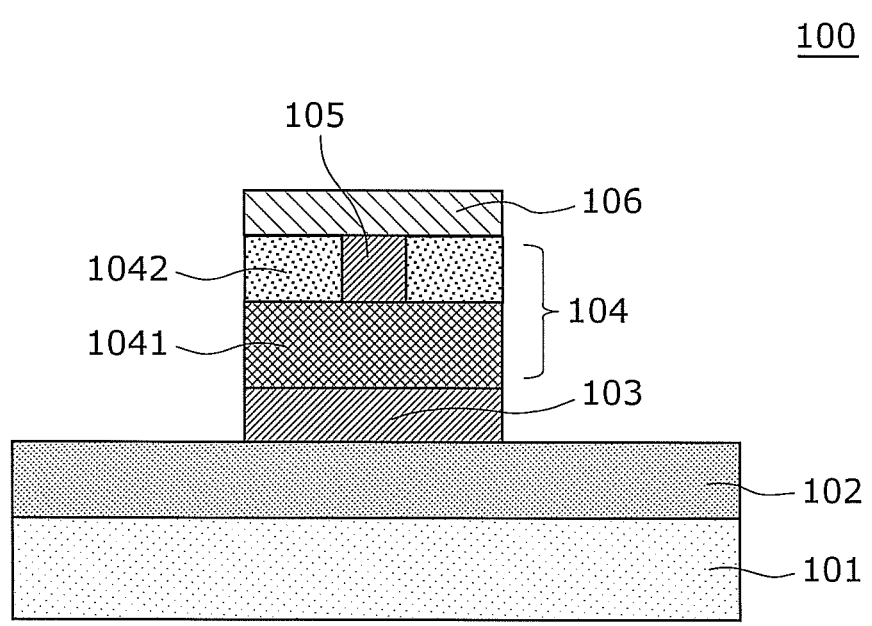
FIG. 2 is a cross-sectional diagram showing another example of the structure of the variable resistance element to be estimated with the estimation methods according to embodiments.

FIG. 2 is a cross-sectional diagram showing an example of the structure of the variable resistance element in which the local region 105 is not in contact with the first electrode 103 but is in contact with the second electrode 106. In the variable resistance element 100 shown in FIG. 2, the variable resistance layer 104 is configured by stacking at least two layers which are a first variable resistance layer 1041 connected to the first electrode 103 and a second variable resistance layer 1042 connected to the second electrode 106. The local region 105 is formed in the second variable resistance layer 1042.

The first variable resistance layer 1041 comprises an oxygen-deficient first metal oxide, and the second variable resistance layer 1042 comprises a second metal oxide having a smaller degree of oxygen deficiency than the first metal oxide. In the second variable resistance layer 1042 of the variable resistance element, a minute local region 105 is formed in which the degree of oxygen deficiency reversibly changes in response to an application of an electric pulse. It is conceivable that the local region 105 includes a filament composed of oxygen defect sites.

The degree of oxygen deficiency refers to the percentage of deficient oxygen with respect to the amount of oxygen included in an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value.

For example, when the metal is tantalum (Ta), the oxide having the stoichiometric composition according to the above-described definition is $Ta_2O_5$, and thus can be expressed as $TaO_{2.5}$. The degree of oxygen deficiency of $TaO_{2.5}$ is 0%, and the degree of oxygen deficiency of $TaO_{1.5}$ becomes: degree of oxygen deficiency=(2.5−1.5)/2.5=40%. Furthermore, a metal oxide having excess oxygen has a degree of oxygen deficiency with a negative value. It should be noted that in this description, unless stated otherwise, the degree of oxygen deficiency includes positive values, 0 (zero), and negative values.

An oxide having a lower degree of oxygen deficiency is closer to the oxide of stoichiometric composition and therefore has a higher resistance value, and an oxide having a higher degree of oxygen deficiency is closer to the metal included in the oxide and therefore has a lower resistance value.

Oxygen content atomic percentage is a ratio of oxygen atoms to the total number of atoms. For example, the oxygen content atomic percentage of $Ta_2O_5$ is the ratio of oxygen atoms to the total number of atoms (O/(Ta+O)), and becomes 71.4 atm %. Therefore, an oxygen-deficient tantalum oxide has an oxygen content atomic percentage greater than 0 and less than 71.4 atm %. For example, when the metal included in a first metal oxide and the metal included in a second metal oxide are of the same type, the oxygen content atomic percentage is in a correspondence relation with the degree of oxygen deficiency. In other words, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

A metal included in the variable resistance layer 104 may be a transition metal or aluminum (Al). The transition metal may be tantalum (Ta), titanium (Ti), hafnium (Hf), zirconium (Zr), niobium (Nb), tungsten (W), nickel (Ni), or the like. Since transition metals can take a plurality of oxidation states, different resistance states can be realized by an oxidation-reduction reaction.

For example, in the case of using a tantalum oxide for the variable resistance layer 104, the resistance value of the variable resistance layer 104 can be rapidly changed in a stable manner when, in the case where the composition of the first metal oxide included in the first variable resistance layer 1041 is expressed as $TaO_x$, x is at least 0.8 and at most 1.9, and when, in the case where the composition of the second metal oxide included in the second variable resistance layer 1042 is expressed as $TaO_y$, y is larger than the value of x. In this case, the film thickness of the second variable resistance layer 1042 may be at least 1 nm and at most 8 nm.

Furthermore, in the case of using a hafnium oxide for the variable resistance layer 104, the resistance value of the variable resistance layer 104 can be rapidly changed in a stable manner when, in the case where the composition of the first metal oxide included in the first variable resistance layer 1041 is expressed as $HfO_x$, x is at least 0.9 and at most 1.6, and when, in the case where the composition of the second metal oxide included in the second variable resistance layer 1042 is expressed as $HfO_y$, y is larger than the value of x. In this case, the film thickness of the second variable resistance layer 1042 may be at least 3 nm and at most 4 nm.

Furthermore, in the case of using a zirconium oxide for the variable resistance layer 104, the resistance value of the variable resistance layer 104 can be rapidly changed in a stable manner when, in the case where the composition of the first metal oxide included in the first variable resistance layer 1041 is expressed as $ZrO_x$, x is at least 0.9 and at most 1.4, and when, in the case where the composition of the second metal oxide included in the second variable resistance layer 1042 is expressed as $ZrO_y$, y is larger than the value of x. In this case, the film thickness of the second variable resistance layer 1042 may be at least 1 nm and at most 5 nm.

Different metals may be used for the first metal included in the first metal oxide forming the first variable resistance layer 1041 and the second metal included in the second metal oxide forming the second variable resistance layer 1042. In this case, the second metal oxide may have a lower degree of oxygen deficiency, that is, a higher resistance, than the first metal oxide. By adopting such a structure, the voltage applied between the first electrode 103 and the second electrode 106 at the time of resistance change is distributed more to the second variable resistance layer 1042, and thus it becomes possible to facilitate the oxidation-reduction reaction which occurs in the second metal oxide.

Furthermore, when the materials used for the first metal included in the first metal oxide and the second metal included in the second metal oxide are different from each other, the second metal may have a standard electrode potential lower than the standard electrode potential of the first metal. The higher the standard electrode potential of a material is, the more difficult it is to oxidize the material. With this, oxidation-reduction reaction occurs more easily in the second variable resistance layer 1042 comprising the second metal oxide having a relatively low standard electrode potential. Note that, it is conceivable that the resistance change phenomenon is a change in resistance value (oxygen deficient degree) of the second metal oxide attributed to the change in the filament (conductive path) due to an oxidation-reduction reaction that is assumed to occur in a minute local region formed in the second metal oxide having a high resistance.

For example, stable resistance change operation is achieved when an oxygen-deficient tantalum oxide ($TaO_x$) is used for the first metal oxide, and a titanium oxide ($TiO_2$) is used for the second metal oxide. Titanium (standard electrode potential=−1.63 eV) is a material having a lower standard electrode potential than tantalum (standard electrode potential=−0.6 eV). As described, when an oxide of a metal having a lower standard electrode potential than the first metal oxide is used for the second metal oxide, the oxidation-reduction occurs more easily in the second metal oxide.

As other combinations, an aluminum oxide ($Al_2O_3$) can be used for the second metal oxide. For example, an oxygen-deficient tantalum oxide ($TaO_x$) may be used for the first metal oxide, and an aluminum oxide ($Al_2O_3$) may be used for the second metal oxide.

In both cases of high resistance programming and low resistance programming, it is conceivable that the resistance changing phenomenon in the variable resistance layer 104 having the stacked structure is a change in resistance value of the variable resistance layer 104 caused by change in filaments (conductive paths) in a local region 105 due to an oxidation-reduction reaction that is assumed to occur in a minute local region 105 formed in the second variable resistance layer 1042 comprising the second metal oxide having a high resistance.

In other words, when a voltage that is positive with respect to the first electrode 103 is applied to the second electrode 106 connected to the second variable resistance layer 1042, oxygen ions in the variable resistance layer 104 are pulled toward the second variable resistance layer 1042- side. With this, an oxidation reaction occurs in the minute local region 105 formed in the second variable resistance layer 1042, and the degree of oxygen deficiency decreases. As a result, it is conceivable that it becomes difficult for the filaments inside the local region 105 to be formed, increasing the resistance value.

Conversely, when a voltage that is negative with respect to the first electrode 103 is applied to the second electrode 106 connected to the second variable resistance layer 1042, the oxygen ions in the second variable resistance layer 1042 are pushed toward the first variable resistance layer 1041-side. With this, a reduction reaction occurs in the minute local region 105 formed in the second variable resistance layer 1042, and the degree of oxygen deficiency increases. As a result, it is conceivable that formation of the filaments inside the local region 105 is facilitated, decreasing the resistance value.

A material for the second electrode 106 connected to the second variable resistance layer 1042 which comprises the second metal oxide having a lower degree of oxygen deficiency may be, for example, platinum (Pt), iridium (Ir), or palladium (Pd), which has a high standard electrode potential compared to the metal included in the second metal oxide and the material included in the first electrode 103. Furthermore, a material for the first electrode 103 connected to the first variable resistance layer 1041 which comprises the first metal oxide having a higher degree of oxygen deficiency may be, for example, tungsten (W), nickel (Ni), tantalum (Ta), titanium (Ti), aluminum (Al), tantalum nitride (TaN), or titanium nitride (TiN), which has a low standard electrode potential compared to the metal included in the first metal oxide. The higher the standard electrode potential of a material is, the more difficult it is to oxidize the material.

Specifically, the relationships Vr2<V2 and V1<V2 may be satisfied, where V2 represents the standard electrode potential of the second electrode 106, Vr2 represents the standard electrode potential of the metal included in the second metal oxide, and Vr1 represents the standard electrode potential of the metal included in the first metal oxide, and V1 represents the standard electrode potential of the first electrode 103. In addition, the relationships V2>Vr2 and Vr1≧V1 may be satisfied.

With the above-described structure, in the second metal oxide, an oxidation-reduction reaction selectively occurs in the vicinity of the interface between the second electrode 106 and the second variable resistance layer 1042, and a stable resistance changing phenomenon can be realized.

Furthermore, a plurality of the local regions 105 may be formed in the variable resistance layer 104 of the variable resistance element 100. When a difference in resistance change characteristics of the variable resistance element 100 is small between the case where the local regions 105 is regarded as one local region and the case where only one local region 105 is actually formed, an accurate estimation can be performed for variable resistance element 100 even when a plurality of the local regions 105 are formed. However, when one local region 105 is formed in one variable resistance layer 104, amount of variation in resistance value of the variable resistance element 100 can be reduced, and thus estimation can be accurately performed for the variable resistance element 100.

Note that, the number of the local regions 105 formed in the variable resistance layer 104 can be observed with EBAC analysis.

Note that, the memory cell may include the variable resistance element 100 and a combination of, for example, fixed resistor, a transistor, or a diode.

The following briefly describes operations of the variable resistance element having the above-described structure. The operations of the variable resistance element include an initial breakdown operation, a programming operation, and a read operation.

Figure 3:
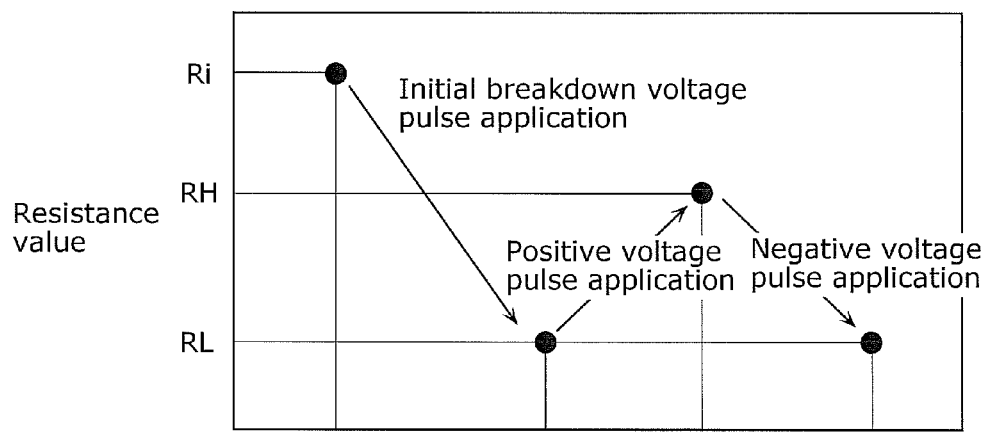
FIG. 3 is a diagram showing an example of a change in resistive status of the variable resistance element.

FIG. 3 shows an example of a change in resistance value of the variable resistance element 100 during such operations.

In the initial breakdown operation, the initial breakdown voltage is applied to the variable resistance element 100 in which the local region 105 is not formed after being manufactured. As indicated by an initial resistance value Ri in FIG. 3, the variable resistance element 100 in which the local region 105 is not formed has a resistance value of, for example, $10^7$ to $10^8 \Omega$ that is higher than a resistance value RH in a high resistance state.

FIG. 3 indicates a change in resistance in the case where an initial breakdown voltage having a negative polarity is applied to the variable resistance element 100. When the potential of the second electrode 106 is lower than the potential of the first electrode 103, it defines a voltage having a negative polarity. When the initial breakdown voltage having a negative polarity is applied, the variable resistance element exhibits change in resistive status from the initial resistance value Ri to a resistance value RL in a low resistance state.

Note that, in the initial breakdown operation, an initial breakdown voltage having a positive polarity may be applied to change the resistance value from the initial resistance value Ri to a resistance value RH in a high resistance state. When the potential of the second electrode 106 is higher than the potential of the first electrode 103, it defines the voltage having a positive polarity. The initial breakdown operation is performed, for example, right after the manufacturing, and a normal programming operation or a read operation is executed thereinafter.

In the programming operation, an electric pulse having a greater amplitude (hereinafter, where necessary, referred to as a "programming voltage") than a predetermined threshold voltage is applied between the first electrode 103 and the second electrode 106 of the variable resistance element 100. The change to a high resistance state or to a low resistance state occurs according to the polarity of the programming voltage. Specifically, for example, an electric pulse having a pulse width of 100 ns is applied as the programming voltage.

In FIG. 3, after the application of the initial breakdown voltage, a programming voltage having a positive polarity (positive voltage pulse in FIG. 3) is applied. With this, the resistive status of the variable resistance element 100 changes from a low resistance state to a high resistance state.

Furthermore, in FIG. 3, after the application of the positive voltage pulse, a programming voltage having a negative polarity (negative voltage pulse in FIG. 3) is applied. With this, the resistive status of the variable resistance element 100 changes from a high resistance state to a low resistance state.

In the read operation, an electric pulse (read voltage) having an amplitude smaller than the above-described threshold voltage is applied to the variable resistance element. Application of the read voltage does not change the resistance value of the variable resistance element 100. Sensing the current that flows in the variable resistance element in the read operation makes it possible to find whether the resistive status of the variable resistance element 100 is a low resistance state or a high resistance state, and read the value stored in the variable resistance element.

4. Model of Local Region and Calculation of Theoretical Resistance Value

The following describes a model for expressing the resistive status of the above-described local region, which is devised by the inventors of the present application. The estimation methods according to embodiments which are described later are based on this model.

Figure 4:
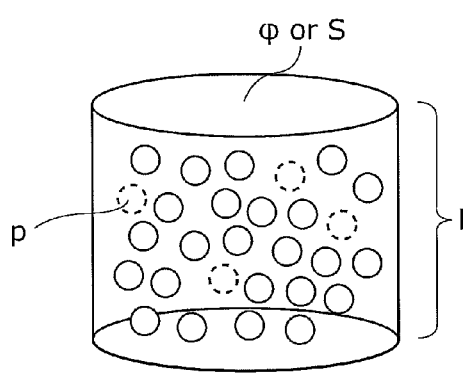
FIG. 4 is a schematic diagram showing an example of structural characteristics of a local region.

FIG. 4 is a schematic diagram showing an example of structural characteristics of the local region.

FIG. 4 shows, as examples of physical parameters regarding structural characteristics of the local region 105, a dimension and a packing density of defects p of the local region 105. The dimension of the local region 105 is represented by a length l and one of a diameter φ and an area S of the local region 105, and the packing density of defects p of the local region 105 is indicated with a density of defect of oxygen ions.

The resistive status of the local region 105 having the above-described structural characteristics is expressed as follows using a percolation model.

The percolation model represents the local region 105 with a three-dimensional region having the diameter φ or an area S and length l shown in FIG. 4, and represents a site in the local region 105 with a plurality of partial regions (three-dimensional mesh) obtained by dividing the three-dimensional region into a lattice. Each of the partial regions is a cube-shaped region, and a side of the cube is a site interval d. The number of the sites and an arrangement of the sites in the local region 105 are determined based on the diameter φ, the length l, and the site interval d of the local region 105. The sites schematically represent the positions of the oxygen ions in the local region 105.

A simulation is performed in which defect sites are randomly allocated to the number of sites, among the sites in the local region 105, which corresponds to the packing density of defects p shown in FIG. 4. The greater the packing density of defects p is, the larger number of defect sites are arranged. Here, the defect site means a site in which, in a metal oxide included in the local region 105, oxygen ions are missing which should exist if the metal oxide has a stoichiometric composition. Note that, the density of the defect sites also corresponds to a degree of oxygen deficiency. In other words, the greater the degree of oxygen deficiency is, the greater the density of the defect sites is.

In the percolation model, based on the fact that a current flows between the adjacent defect sites, it is assumed that a filament, which is a conductive path in the local region 105, is formed when the oxygen defect sites in the local region 105 are connected. When the density of the defect sites is small, defect sites are not connected, and filaments are not formed. When the density of the defect sites exceeds a certain threshold value, defect sites are connected to extend from a portion closest to the first electrode 103 and a peripheral portion of the first electrode 103 to a portion in contact with the second electrode 106. Specifically, a filament is formed.

In this manner, the resistive status of the local region 105 is expressed with a formation state of the filament in the percolation model which corresponds to the amount of physical parameters regarding the structural characteristics and a site interval of the local region 105.

Figures 5A, 5B, 5C:
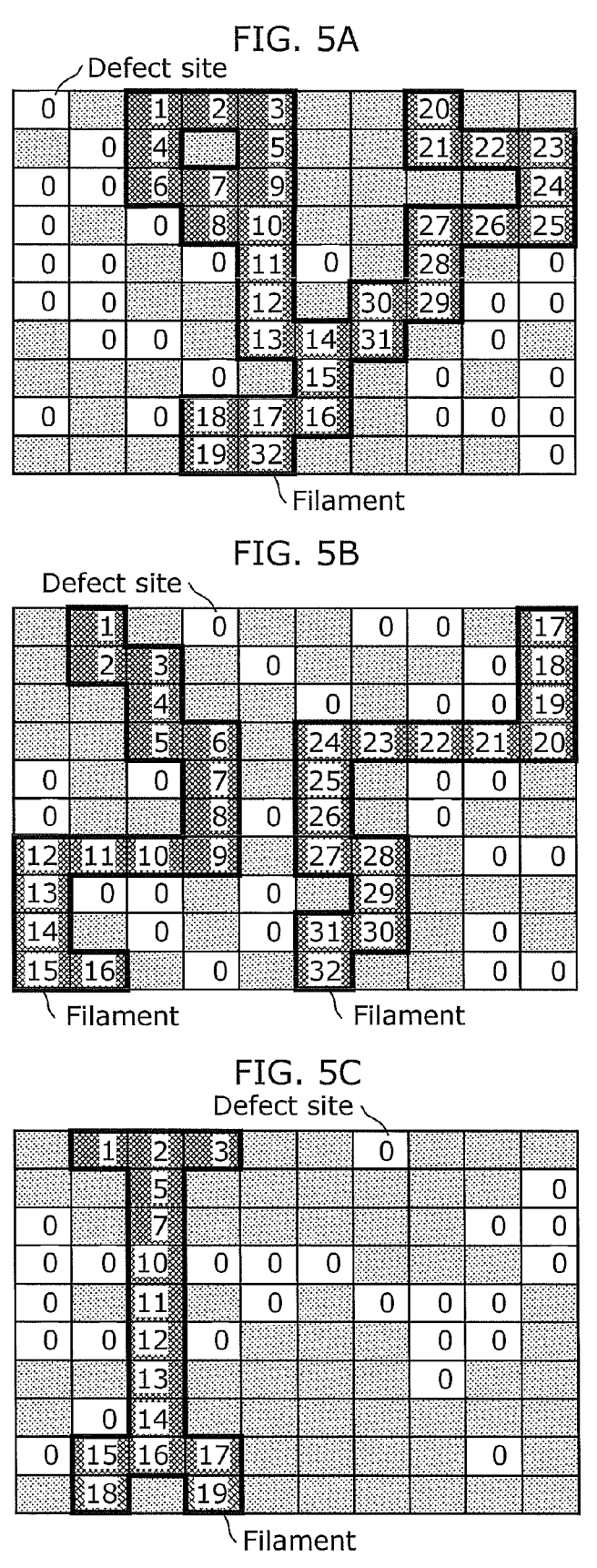

Each of FIG. 5A to FIG. 5C is a diagram showing an example of a percolation model in which some of the sites are allocated with defect sites by simulation. For the sake of explanation, each of FIG. 5A to FIG. 5C shows sites which are positioned in a cross-section of the local region 105 perpendicular to the substrate 101.

In the simulation, the defect sites are randomly allocated. Thus, even when the amount of the physical parameter regarding the structural characteristics of the local region is the same, each of simulations produces a result indicating a different resistance state.

In FIG. 5A to FIG. 5C, the site allocated with a number represents a defect site. Among the sites which are allocated with the numbers, the site allocated with "0" is a site that does not form a filament. The sites which are allocated with the numbers other than "0" are sites which form a filament. The site which is not allocated with the number includes an oxygen ion.

Note that, as FIG. 5A to FIG. 5C show, the number of the filaments formed in the local region 105 is not limited to one but a plurality of filaments may be formed. In the percolation model, a probabilistic number of the filaments in possible shapes are formed. The distribution of the resistance states of the local region 105 expressed according to the number of filaments and the shapes of the filaments corresponds to the distribution of the resistance values of the local region 105.

The percolation model determined to be in one of the resistance states has nodes which correspond to the defect sites, and is represented with an equivalent circuit in which each pair of adjacent nodes is connected with an inter-site resistance r.

The resistance value of the local region 105 is assumed to be a resistance value between the node connected to the first electrode 103 and the node connected to the second electrode 106 in the equivalent circuit, and is calculated applying an idea of a known network analysis as follows.

It is assumed that a direct voltage is applied to the local region 105 via the first electrode 103 and the second electrode 106. More specifically, it is assumed that the direct voltage is applied between the node connected to the first electrode 103 and the node connected to the second electrode 106.

The potential V of each node is expressed using an expression including a potential of an adjacent node and the inter-site resistance r, according to Kirchhoff's laws. An expression is formulated for potentials of all the nodes, a boundary condition is fed, and then a potential of each of the nodes is determined by repeatedly performing calculations for all the nodes.

The direct current that flows between adjacent nodes is calculated using the determined potential of each node. The resistance value of the entire equivalent circuit, that is, the resistance value of the local region 105 is theoretically calculated based on the sum of currents that flow in nodes connected to the second electrode 106 and the value of the direct voltage applied to the equivalent circuit.

The resistance value R of the variable resistance element 100 may be calculated by adding, to the calculated resistance value of the local region 105, a fixed resistance value that corresponds to resistance components of the first electrode 103 and the second electrode 106.

In this manner, the resistance value R of the variable resistance element 100 is calculated for the percolation model which is determined to be in one of the resistance states by simulation. The resistance value R is represented as a function of the diameter φ, the length l, the packing density of defects p, the inter-site resistance r, and the site interval d of the local region 105, as shown by Expression (1) below.

[Math. 1]

$$R = f(\phi, l, p, r, d) \quad \text{Expression (1)}$$

Here, the diameter φ, the length l, the packing density of defects p of the local region 105 are variables which are used to estimate resistance change characteristics of the variable resistance element 100. The inter-site resistance r and the site interval d are constants and are values that correspond to a material included in the variable resistance layer 104 are predetermined.

A method for determining the inter-site resistance r and the site interval d is described using an example where the variable resistance layer 104 comprises a tantalum oxide (TaO$_x$).

It is assumed that the variable resistance layer 104 has a crystalline structure of Ta$_2$O$_5$, and the shape of a unit cell of the crystalline structure is approximated by a cube. At this time, it is assumed that the distance between the adjacent cubes is an average of the distances between the centers of the unit cells that are adjacent to each other in the crystalline structure of Ta$_2$O$_5$. The distances are obtained for all the pairs of unit cells in different adjoining directions. The distance between the adjacent cubes corresponds to the site interval d.

The values of the inter-site resistance r and the site interval d are determined as follows by comparing a measurement value and a theoretical value of resistivity of a thin film comprising a tantalum oxide.

A process is controlled to form a thin film which comprises the tantalum oxide and has a predetermined oxygen content atomic percentage, and the resistivity of the formed thin film is actually measured. The resistivity (measurement value) is thus obtained.

The resistivity (theoretical value) of the tantalum oxide with the packing density of defects p that corresponds to the case of the predetermined oxygen content atomic percentage is calculated for each of the combinations in which the inter-site resistance r and the site interval d are different, by applying the aforementioned percolation model and the idea of network analysis. As the resistivity (theoretical value), a center value of resistivities obtained by simulations may be calculated, for example.

The packing density of defects p and the oxygen content atomic percentage are associated as follows, for example. It is assumed that the packing density of defects p of a tantalum oxide having no oxygen deficiency (Ta$_2$O$_5$) is 0, and the packing density of defects p of the tantalum oxide having the greatest oxygen deficiency rate (Ta$_2$O$_{3.25}$) is 1. At this time, p=n/1.75 when the number of deficient oxygen atoms is denoted by n.

The values of the inter-site resistance r and the site interval d used in the simulation from which the resistivity (theoretical value) having the smallest difference from the resistivity (measurement value) is calculated is determined to be the values of the inter-site resistance r and the site interval d corresponding to the tantalum oxide.

Figure 6:
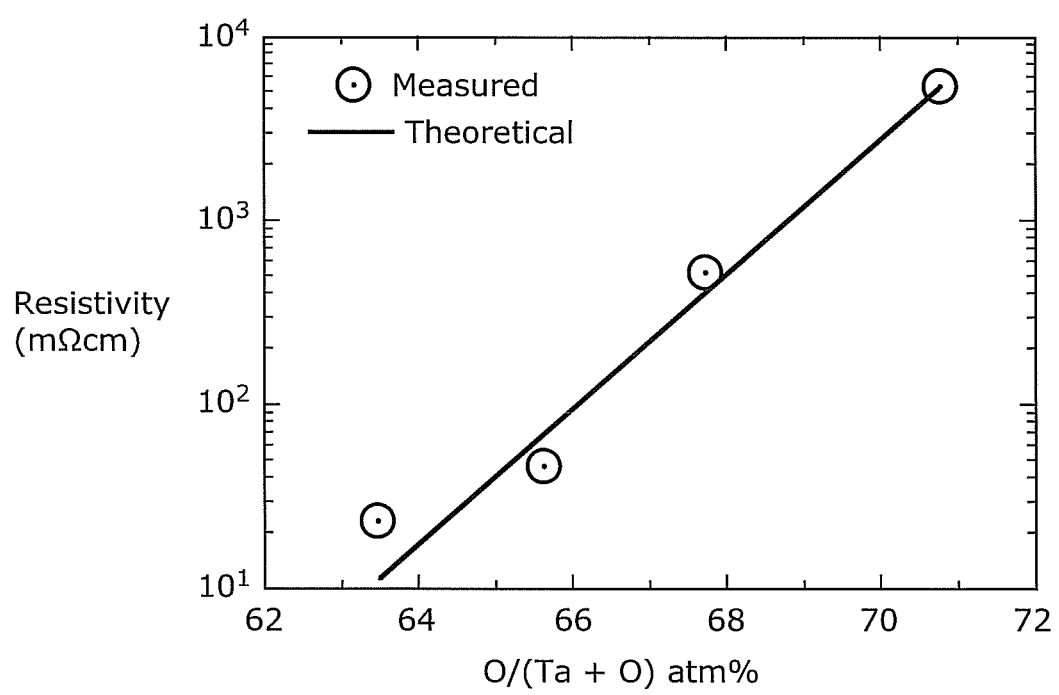
FIG. 6 is a graph showing an example of a measurement value and a theoretical value of resistivity according to an oxygen content atomic percentage in a thin-film comprising a tantalum oxide.

FIG. 6 is a graph showing an example of measurement values and theoretical values of the resistivity according to the oxygen content atomic percentage in the thin film comprising the tantalum oxide. Each of the circles in FIG. 6 indicates a measurement value of the resistivity in the thin film comprising one of four tantalum oxides having different oxygen content atomic percentages. The solid line in FIG. 6 indicates, among theoretical values of resistivity calculated using different combinations of values of the inter-site resistance r and the site interval d, a theoretical value which has smallest difference from each of the measurement values of the resistivity at corresponding one of the oxygen content atomic percentages. The values of the inter-site resistance r and the site interval d in the simulation from which the resistivity (theoretical value) indicated by the solid line in FIG. 6 is calculated are determined as the values of the inter-site resistance r and the site interval d of the tantalum oxide.

As described above, from the percolation model which corresponds to amounts of the diameter φ, the length l, and the packing density of defects p, the resistance value R of the variable resistance element 100 corresponding to one resistance state of the local region 105 is calculated by simulation. Then, a theoretical distribution which is a distribution of the resistance values R is derived by a plurality of simulations.

With the experiments, the inventors of the present application concluded that the distribution of the resistance values R follows a logarithmic normal distribution. The experiment verified that that the electric conductivity of the thin film comprising the tantalum oxide has temperature dependency, that is, the logarithmic of the electric conductivity is proportional to $T^{-1/4}$ at low temperature region and is proportional to 1/T at around room temperature. This indicates that electric conduction in the thin-film comprising a tantalum oxide occurs due to hopping conduction. It is known that the distribution of resistance values of a conductive material in which the hopping conduction occurs follows the logarithmic normal distribution (e.g., NPL 2: Yakov M. Strelniker et. al., Phys. Rev. E 72, 016121 (2005)).

Expression (2) shows an example of an expected value P(R) of a resistance value R of the local region 105 in which the hopping conduction occurs.

[Math. 2]

$$P(R) = \frac{1}{\sqrt{2\pi}\,\sigma R}\exp\left(-\frac{\ln^2(R/\langle R \rangle)}{2\sigma^2}\right) \quad \text{Expression (2)}$$

$$\sigma = \frac{bk^v}{L} = \frac{b}{L}\left(\alpha\left(\frac{1}{p}\right)^{\frac{1}{3}}\right)^v$$

Regarding the three-dimensional region, b=0.18, and v=0.88. Furthermore, p denotes a packing density of defects, L is a parameter regarding a dimension of the local region 105 (e.g., the diameter φ, the length l). R is a variable which represents a resistance value, <R> is an average of resistance values, and α is a coefficient.

This finding indicates that, for both of the measurement value and the theoretical value, the distribution of the resistance values of the variable resistance element 100 may be described with a set of resistance values itself or may be described with distribution parameters (e.g., the average of resistance values <R> and coefficient σ) that define the logarithmic normal distribution which approximates the distribution of resistance values.

In the estimation method devised by the inventors of the present application for the variable resistance element, resistance change characteristics of the variable resistance element is quantitatively estimated through a physical parameter regarding the structural characteristics of the local region.

According to an exemplary embodiment disclosed herein, the estimation method basically includes: an obtainment step of obtaining, when changes are made to the resistive status of the local region, measurement values each indicating a resistance state after one of the changes; and a determination step of determining, based on a distribution of the obtained measurement values, an estimated amount of a physical parameter regarding structural characteristics of the local region by a calculation. The above-described percolation model is used in a calculation for determining the estimated amount.

Furthermore, according to an exemplary embodiment disclosed herein, another aspect of the estimation method includes an obtainment step of obtaining an estimated amount of a physical parameter regarding structural characteristics of the local region; and a judgment step of judging whether the variable resistance element is non-defective or defective based on whether or not the obtained estimated amount of the physical parameter satisfies a predetermined condition.

The following describes, in detail, embodiments of such an estimation method, an estimation device, an inspection device, and a nonvolatile memory device.

Embodiment 1

5. Estimation Method Based on Comparison Between Theoretical Distribution and Measured Distribution of Resistance States An estimation method for the variable resistance element according to Embodiment 1, and an estimation device for executing the estimation method are described.

An estimation method according to Embodiment 1 is a method in which (i) a theoretical distribution which is a distribution of resistance states theoretically derived from a model of a local region having a reference amount of the physical parameter and (ii) a distribution of resistance states each indicating a resistance state, when changes are made to the resistive status of the local region, after one of the changes (hereinafter referred to as a measured distribution for the differentiation from the theoretical distribution), and when the theoretical distribution and the measured distribution match to a predetermined degree, the estimated amount of the physical parameter is determined to be the reference amount.

Figure 7:
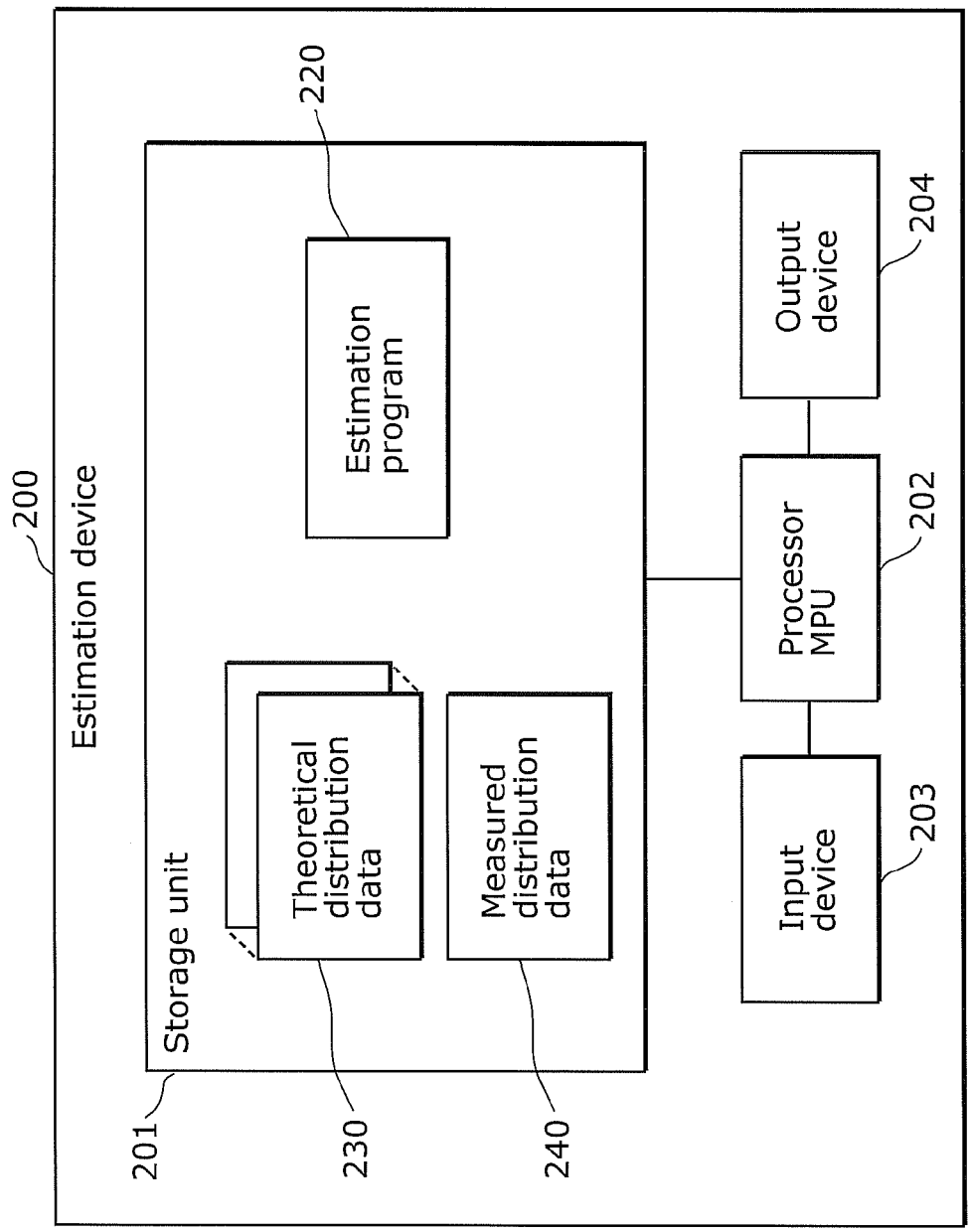
FIG. 7 is a block diagram showing an example of a hardware structure of an estimation device for a variable resistance element according to Embodiment 1.

FIG. 7 is a block diagram showing an example of a hardware structure of an estimation device for executing an estimation method for the variable resistance element according to Embodiment 1.

As shown in FIG. 7 an estimation device 200 includes: a storage unit 201, a processor 202, an input device 203, and an output device 204.

The storage unit 201 includes, for example, a hard disk drive, a random access memory (RAM), or a combination thereof. The processor 202 includes a micro-processing unit (MPU). The input device 203 includes, for example, a keyboard, a mouse, or a combination thereof. The output device 204 includes, for example, a display.

The storage unit 201 stores an estimation program 220, one or more pieces of theoretical distribution data 230, and measured distribution data 240.

The estimation program 220 is a program which is for causing the processor 202 to execute the estimation method for the variable resistance element according to Embodiment 1.

The theoretical distribution data 230 is data which represents a theoretical distribution of the resistance states of the variable resistance element 100. The theoretical distribution is derived from the percolation model having a reference amount of the physical parameter regarding structural characteristics of the local region 105. A database of plural pieces the theoretical distribution data 230 which correspond to a plurality of reference amounts of the physical parameter different from each other may be formed. The theoretical distribution data 230 may be, for example, a set of resistance values (theoretical values) or distribution parameter of a logarithmic normal distribution which approximates the distribution of the resistance values (theoretical values).

The measured distribution data 240 is data which represents distribution of the measurement values each indicating the resistance states after one of the changes made to the resistive status of the local region 105 of the variable resistance element 100. The measured distribution data 240 includes distribution data of measurement values of the variable resistance element 100 in a high resistance state and distribution data of measurement values of the variable resistance element 100 in a low resistance state. The measured distribution data 240 may be, for example, a set of resistance values (measurement values) in a high resistance state and a low resistance state or may be a distribution parameter of a logarithmic normal distribution which approximates the distribution of the resistance values (measurement values).

Figure 8:
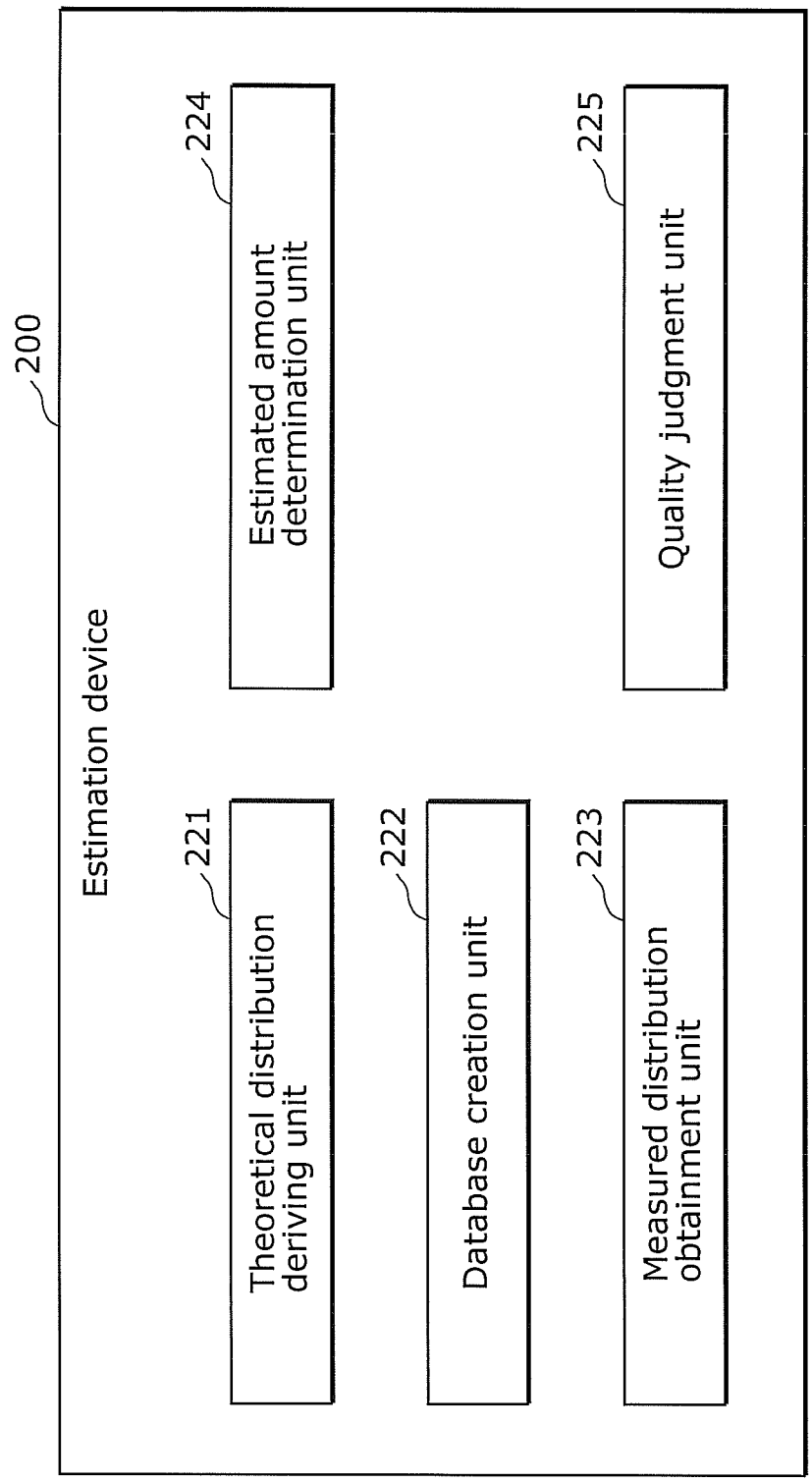
FIG. 8 is a block diagram showing an example of a functional structure of the estimation device for a variable resistance element according to Embodiment 1.

FIG. 8 is a block diagram showing an example of a functional structure of the estimation device 200.

The estimation device 200 includes a theoretical distribution deriving unit 221, a database creation unit 222, a measured distribution obtainment unit 223, an estimated amount determination unit 224, and a quality judgment unit 225. Each unit shown in FIG. 8 may be a function of software which is realized by the execution of the estimation program 220 by the processor 202.

The theoretical distribution deriving unit 221 calculates, from the percolation model in which amount of a physical parameter regarding the structural characteristics of the local region 105 is the reference amount, theoretical values each of which indicates a theoretical resistance state of the variable resistance element 100, and derive the theoretical distribution data 230 which represents the distribution of the calculated theoretical values.

The database creation unit 222 notifies the theoretical distribution deriving unit 221 of reference amounts of the physical parameter which are different from each other. The theoretical distribution deriving unit 221 creates a database of the theoretical distribution data 230 which is derived corresponding to each of the reference amounts.

The measured distribution obtainment unit 223 obtains, when changes are made to the resistive status of the local region 105, electrical measurement values each indicating a resistance state after one of the changes, and derives the measured distribution data 240 which represents the distribution of the obtained measurement values.

The estimated amount determination unit 224 determines that an estimated amount of the physical parameter of the variable resistance element 100 is a reference amount, which corresponds to the theoretical distribution data 230 representing the distribution that matches, to a predetermined degree, with the distribution represented by the measured distribution data 240.

The quality judgment unit 225 judges whether the variable resistance element 100 is non-defective or defective based on whether the determined estimated amount satisfies a predetermined condition or not.

Next, an estimation method for the variable resistance element executed by the estimation device 200 having the above-described structure is described.

Figure 9:
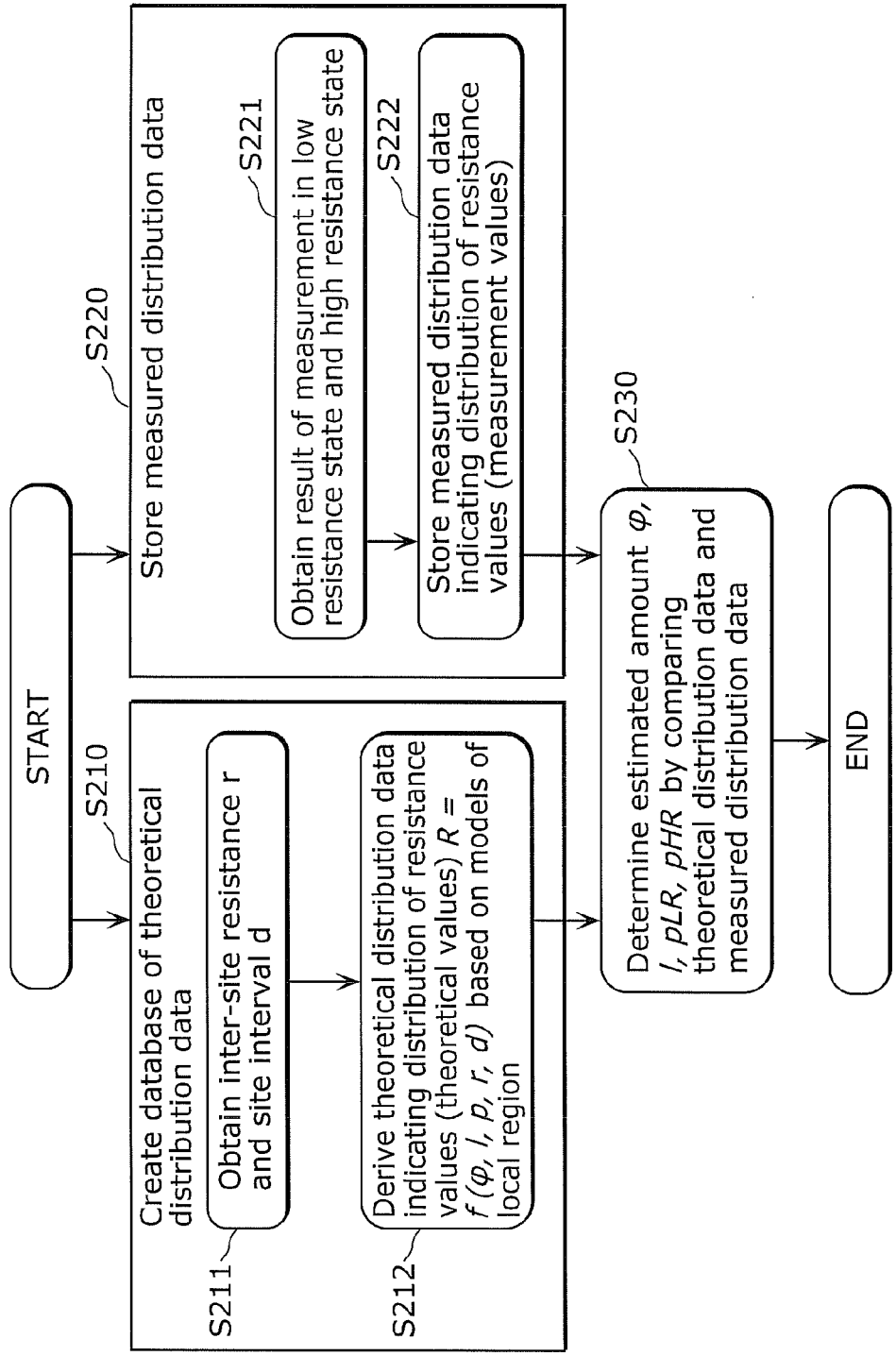
FIG. 9 is a flowchart showing an example of an estimation method for the variable resistance element according to Embodiment 1.

FIG. 9 is a flowchart showing an example of the estimation method for the variable resistance element according to Embodiment 1.

The estimation method shown in FIG. 9 includes the execution of a step in which a database of plural pieces of the theoretical distribution data 230 is created (S210), a step in which the resistance values of the variable resistance element 100 are actually measured and the measured distribution data 240 is stored (S220), and a step in which the measured distribution data 240 and the theoretical distribution data 230 in the database are compared to determine the estimated amount of the physical parameter of the local region 105 (S230). Note that, Step S210 in which the database is created may be executed when the estimation is performed for the variable resistance element 100 or may be executed beforehand.

The theoretical distribution deriving unit 221 obtains the inter-site resistance r and the site interval d (S211). As described above, the inter-site resistance r and the site interval d are constants that are determined according to a material included in the variable resistance layer 104. The inter-site resistance r and the site interval d may be inputted through the input device 203 such as a keyboard or the like or may be calculated by the theoretical distribution deriving unit 221 by inputting the material included in the variable resistance layer 104.

The database creation unit 222 notifies the theoretical distribution deriving unit 221 of different combinations of reference values of the diameters φ, the length l, and the packing density of defects p of the local region.

The theoretical distribution deriving unit 221 derives plural pieces of the theoretical distribution data 230 each of which corresponds to a different one of the combinations of reference values of the diameter φ, the length l, and the packing density of defects p of the local region notified by the database creation unit 222, by using the inter-site resistance r, and the site interval d obtained in Step S211 (S212).

The database creation unit 222 creates database which shows the plural pieces of the theoretical distribution data 230 derived by the theoretical distribution deriving unit 221 in association with reference values of the diameter φ, the length l, and the packing density of defects p of the local region, and stores the database in the storage unit 201.

The measured distribution obtainment unit 223 obtains measurement values indicating resistance values of the variable resistance element 100 in low resistance states and resistance values in high resistance states (S221). Each of the measurement values obtained is a value actually measured after one of the changes made to the resistive status of the local region 105 by alternately applying a negative voltage pulse and a positive voltage pulse for programming to the variable resistance element 100.

The measured distribution obtainment unit 223 stores, in the storage unit 201, the measured distribution data 240 representing the distribution of the resistance values indicated by the measurement values obtained in Step S221 (S222).

From the database created in Step S212, the estimated amount determination unit 224 searches for the theoretical distribution data 230 which matches to the highest degree with the distribution represented by the measured distribution data 240 stored in Step S222.

The degree of correspondence between the distribution represented by the measured distribution data 240 and the distribution represented by the theoretical distribution data 230 is defined as follows, for example.

In the case where each of the measured distribution data 240 and the theoretical distribution data 230 is a distribution parameter of a logarithmic normal distribution, the degree of correspondence between the distribution represented by the measured distribution data 240 and the distribution represented by the theoretical distribution data 230 is defined to be higher when the difference between the distribution parameters is smaller.

Furthermore, in the case where the measured distribution data 240 and the theoretical distribution data 230 is a set of resistance values (measurement values) and a set of resistance values (theoretical values) respectively, the degree of correspondence between the distribution represented by the measured distribution data 240 and the distribution represented by the theoretical distribution data 230 is defined to be higher when the difference between the slope of a straight line drawn on the normal probability plot of the measurement values and the slope of the straight line drawn on the normal probability plot of the theoretical values is smaller. Note that, the data having a significantly large value and data having a significantly small value compared to a predetermined threshold value may be excluded to draw the straight line.

The estimated amount determination unit 224 searches for the theoretical distribution data 230 representing the distribution which matches to the highest degree with the distribution represented by the measured distribution data 240, and determine the reference amount which corresponds to the searched theoretical distribution data item 230 to be the estimated amount of the physical parameter of the variable resistance element 100.

When the diameter φ and the length l of the local region 105 do not change before and after the change in the resistive status of the local region 105, but only the packing density of defects p changes, the range searched for is limited to plural pieces of the theoretical distribution data 230 including reference values in which combination of the diameter φ and the length l of the local region 105 is identical.

From such a search range, the estimated amount determination unit 224 searches for one theoretical distribution data item 230 which matches to the highest degree with the distribution of the resistance values (measurement values) in the high resistance state and one theoretical distribution data item 230 which matches to the highest degree with the distribution of the resistance values (measurement values) in the low resistance state.

The estimated amount determination unit 224 determines the reference amount of the diameter φ, the length l, a packing density of defects pHR in a high resistance state, and a packing density of defects pLR in a low resistance state which correspond to the searched theoretical distribution data item 230 to be the estimated amount of the diameter φ, the length l, the packing density of defects pHR in a high resistance state, and the packing density of defects pLR in a low resistance state of the local region 105, respectively.

The inventors of the present application conducted an experiment to perform estimation for an actually fabricated sample of the variable resistance element 100 according to the above estimation method. The following describes the experiment.

First, the sample of the variable resistance element 100 shown in FIG. 2 is fabricated, and the estimated amount of the local region 105 of the sample according to the estimation method is determined.

Figure 10:
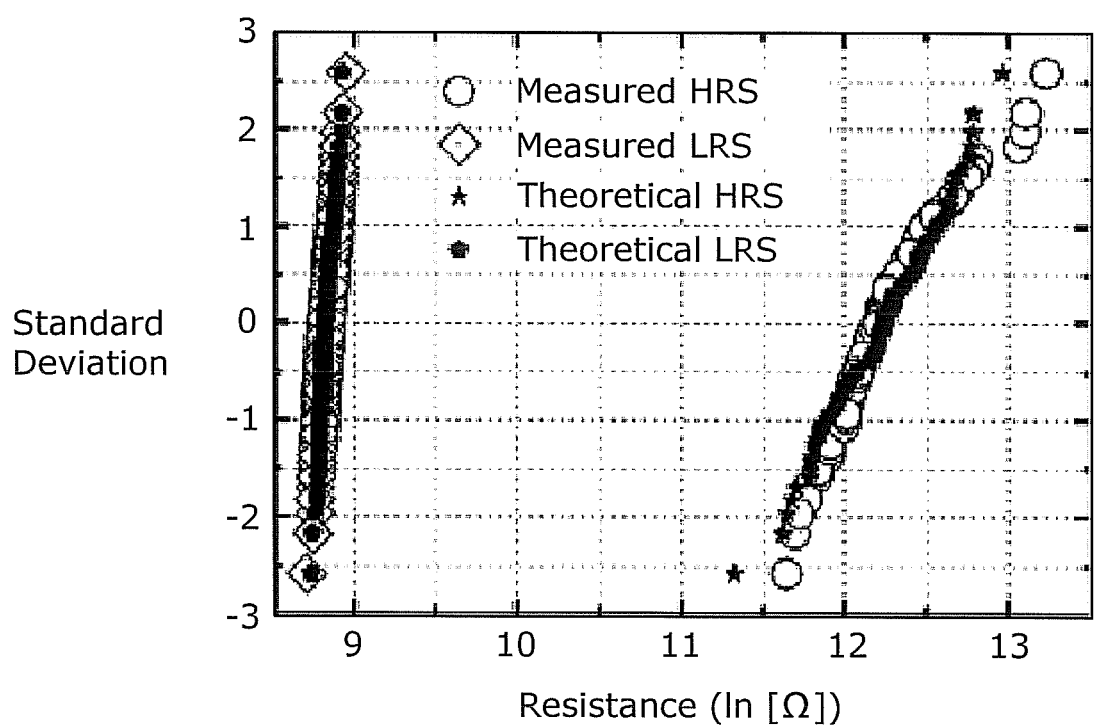
FIG. 10 is an example of a normal probability plot showing (i) an example of measured distribution of resistance values actually measured using a sample of the variable resistance element and (ii) an example of theoretical distribution of resistance values of the variable resistance element which are theoretically derived from a model of the local region.

FIG. 10 is an example of the normal probability plot showing an example of the measured distribution of resistance values actually measured using the sample and an example of theoretical distribution of the resistance values theoretically calculated from the model of the local region 105. FIG. 10 shows the theoretical distribution which matches to the highest degree with the measured distribution from among the theoretical distributions of the resistance values that are theoretically calculated from the model of the local region 105.

In FIG. 10, the horizontal axis indicates a logarithm of the resistance value and the vertical axis indicates the standard deviation. A circle indicates a resistance value (measurement value) in a high resistance state, and a rhombus indicates a resistance value (measurement value) in a low resistance state. A star indicates a resistance value (theoretical value) in a high resistance state, and a pentagon indicates a resistance value (theoretical value) in a low resistance state.

According to the correspondence between the distributions, the estimated amounts of the local region 105 of the sample is determined to be the diameter $\phi=27.2$ nm, the length $l=2.74$ nm, the packing density of defects in a high resistance state pHR=0.17, and the packing density of defects in a low resistance state pLR=0.44 which are reference amounts in the simulation that produced the distribution of the resistance values (theoretical values) in FIG. 10.

Next, the local region 105 of the sample is actually observed.

Figure 11:
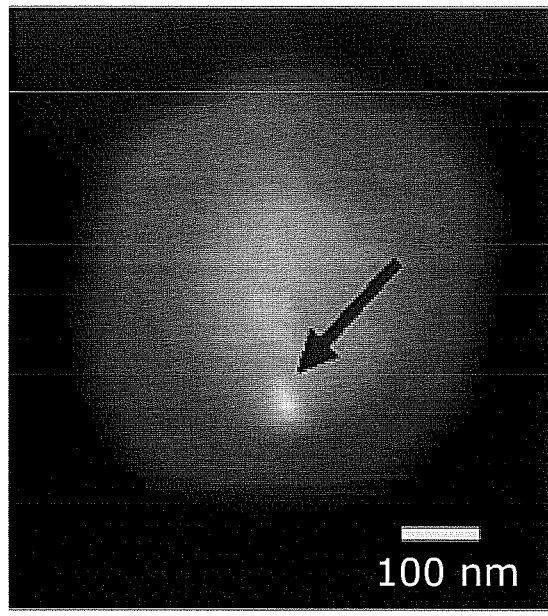
FIG. 11 is an electron beam absorption current (EBAC) photograph of the interface between a variable resistance layer and a second electrode of the sample.

FIG. 11 is a diagram showing a result of analysis on the local region 105 of the sample performed using an EBAC analysis apparatus. FIG. 11 is a photograph in which the interface between the variable resistance layer 104 and the second electrode 106 is captured with EBAC after forming, in the sample, the second electrode 106 having a significantly thin film thickness (to the extent which enables analyzing of the surface of the variable resistance layer 104).

In the EBAC photograph shown in FIG. 11, only one bright region is observed. Note that, in FIG. 11, the bright region and the dark region corresponds to a region having a low resistance and a region having a high resistance, respectively. In other words, the bright region corresponds to the local region 105. The EBAC photograph shown in FIG. 11 indicates that the diameter of the local region 105 of the sample is approximately 30 nm. This is substantially the same as the diameter $\phi$ of the local region 105 determined according to the estimation method, which is 27.2 nm.

Figure 12:
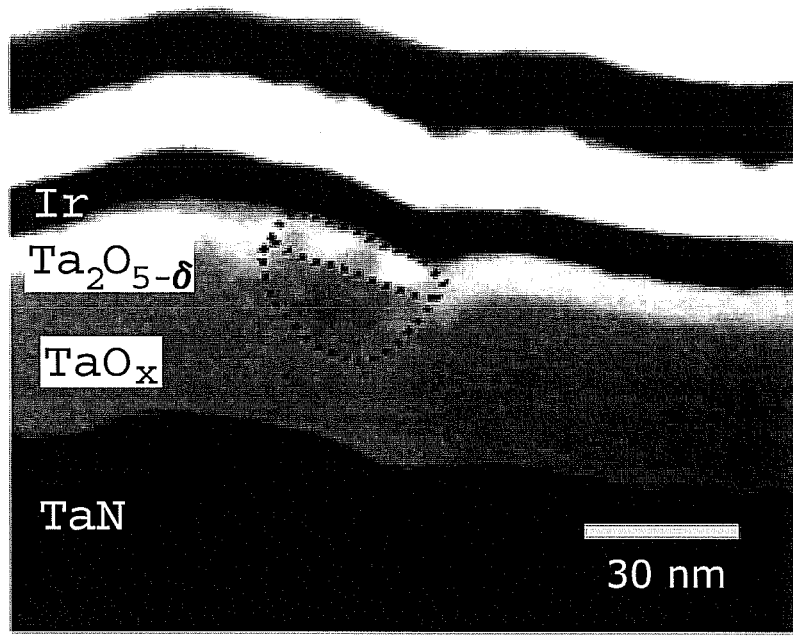
FIG. 12 is a transmission electron microscope (TEM) photograph showing a cross-section that includes a local region of the sample and is perpendicular to a substrate.

FIG. 12 is a diagram indicating a result of observation by a TEM performed on the cross-section of the local region 105 shown in FIG. 11. The TEM photograph shown in FIG. 12 indicates that the thickness of the region (corresponding to the second variable resistance layer 1042) which is shown in white and has high resistance is approximately 3 nm. This is substantially the same as the length $l=2.74$ nm of the local region 105 determined according to the estimation method.

The result of the experiment described above verifies that the estimation method according to Embodiment 1 makes it possible to determine a reasonable estimated amount of the physical parameter regarding the structural characteristics of the local region.

As described above, according to the estimation method and the estimation device for the variable resistance element according to Embodiment 1, the estimated amount of the physical parameter regarding the structural characteristics of the local region 105 of the variable resistance element 100 can be determined from the distribution of the measurement values each indicating a resistance state after one of the changes made to the resistive status of the variable resistance element 100.

The measurement value is measured in a state where the resistive status of the local region 105 can be changed a plurality of times, that is, without destroying the variable resistance element 100. Thus, the determination of the estimated amount can be performed even after the variable resistance element 100 is incorporated into a product such as the nonvolatile memory device or the like, that is, the determination can be performed in a state where the variable resistance element is incorporated in the product, without destroying the variable resistance element and without preparing a special sample of a variable resistance element for estimation.

The determined estimated amount can be used for judging the quality or screening of the variable resistance element 100, for example.

For example, the quality judgment unit 225 can judge that the variable resistance element 100 having physical parameters with estimated amount that does not satisfy a predetermined condition is defective. Then, screening the variable resistance element 100 which is judged to be defective makes it possible to improve a yield and reliability of a product which includes the variable resistance element 100. The judgment of quality and screening of the variable resistance element 100 will be described later in detail.

Embodiment 2

6. Estimation Method Based on Measured Distribution of Resistive Status and Estimation Expression An estimation method for the variable resistance element according to Embodiment 2 and an estimation device for executing the estimation method are described.

In Embodiment 1, an estimated amount of a physical parameter of a local region of the variable resistance element is determined based on a comparison between a theoretical distribution which is a distribution of resistance states theoretically derived from a model of the local region and a measured distribution which is a distribution of the resistance states after the changes made to the resistive status of the local region.

The inventors of the present application further conducted studies and found a novel estimation expression which represents the estimated amount. The estimation expression is expressed by a function of an intermediate representative value and an amount of variations of the measurement values indicating the resistance states included in the measured distribution. In view of this, Embodiment 2 proposes an estimation method in which the estimation expression is used.

In the estimation method according to Embodiment 2, an intermediate representative value and an amount of variation of measurement values each of which indicating a resistance state after one of changes made to the resistive status of the local region are calculated, and the amount obtained by substituting the calculated representative value and the calculated amount of variation into the estimation expression is determined to be the estimated amount of the physical parameter.

Figure 13:
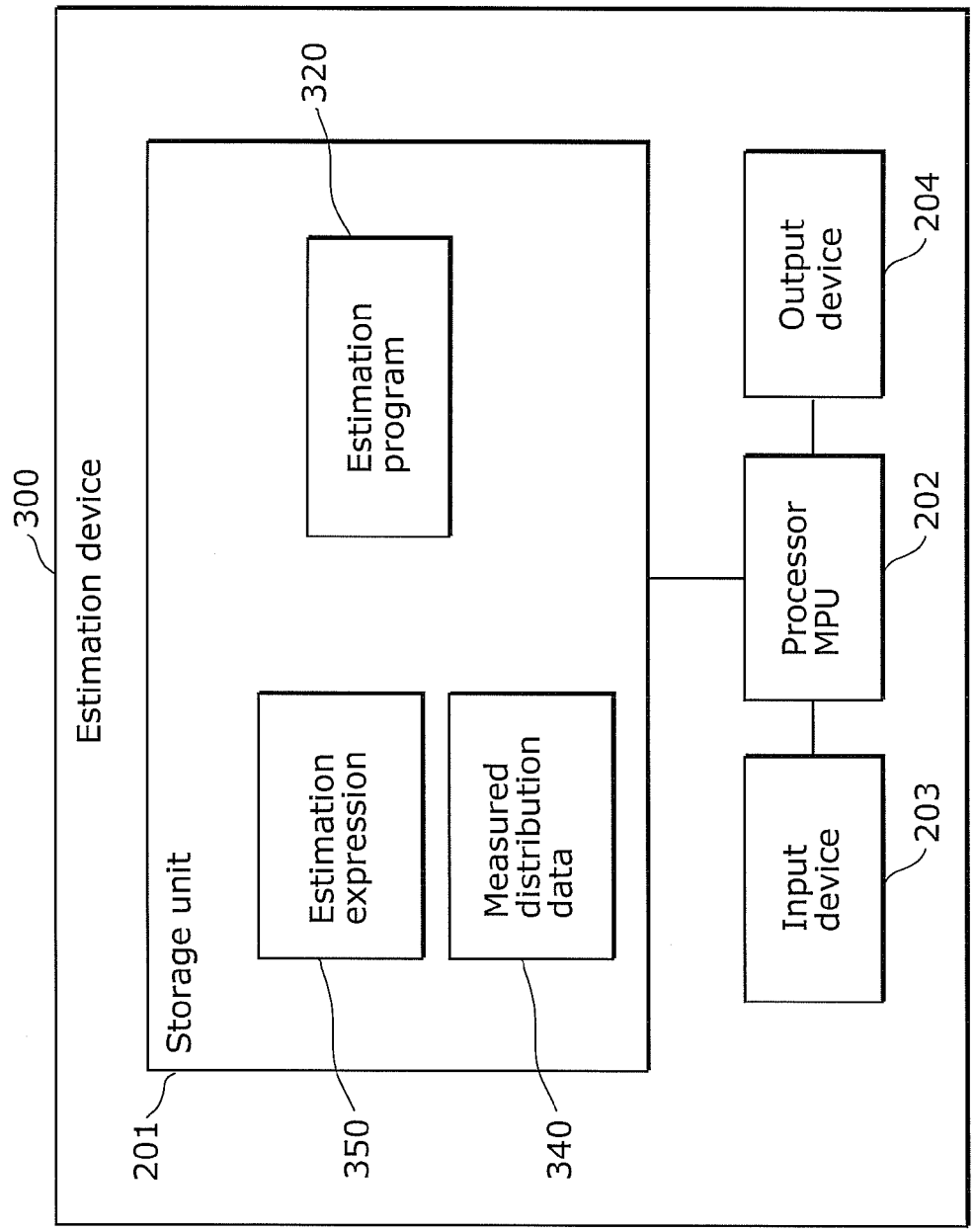
FIG. 13 is a block diagram showing an example of a hardware structure of the estimation device for a variable resistance element according to Embodiment 2.

FIG. 13 is a block diagram showing an example of a hardware structure of an estimation device for executing the estimation method for the variable resistance element according to Embodiment 2.

As shown in FIG. 13, an estimation device 300 includes: a storage unit 201, a processor 202, an input device 203, and an output device 204.

The storage unit 201 stores an estimation program 320, an estimation expression 350, and measured distribution data 340.

The estimation program 320 is a program for causing the processor 202 to execute the estimation method for the variable resistance element according to Embodiment 2.

The measured distribution data 340 is a data representing the distribution of the measurement values each indicating the resistance state after one of the changes made to the resistive status of the local region 105 of the variable resistance element 100. The measured distribution data 340 includes distribution data of the measurement values of the variable resistance element 100 in a high resistance state and distribution data of measurement values of the variable resistance element 100 in a low resistance state. The measured distribution data 340 may be, for example, a set of current values (measurement values corresponding to applications of known voltage) in a high resistance state and a low resistance state.

The estimation expression 350 is a function of an intermediate representative value and an amount of variation of the measurement values indicating an estimated amount of the physical parameter regarding the structural characteristics of the local region 105 of the variable resistance element 100. The estimation expression 350 may be included in the estimation program 320.

Figure 14:
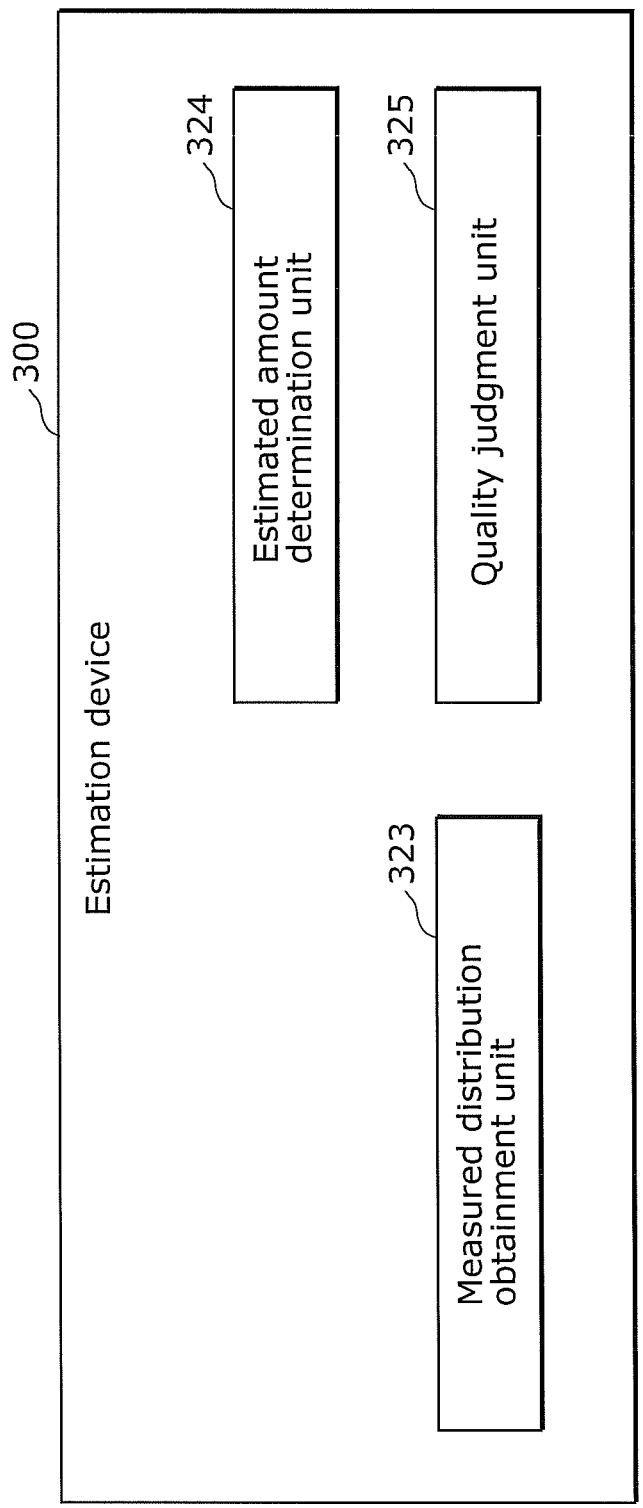
FIG. 14 is a block diagram showing an example of a functional structure of the estimation device for the variable resistance element according to Embodiment 2.

FIG. 14 is a block diagram showing an example of a functional structure of the estimation device 300.

The estimation device 300 includes a measured distribution obtainment unit 323, an estimated amount determination unit 324, and a quality judgment unit 325. Each of the units shown in FIG. 14 may be a function of software realized by the execution of the estimation program 320 by the processor 202.

The measured distribution obtainment unit 323 obtains measurement values each indicating a resistance state after one of the changes made to the resistive status of the local region 105, and stores the measurement values as the measured distribution data 340 in the storage unit 201.

The estimated amount determination unit 324 calculates a representative value which is an intermediate value of the measurement values indicated by the measured distribution data 340, and an amount of variation of the measurement values indicated by the measured distribution data 340, and determines that the estimated amount of the physical parameter of the variable resistance element 100 is the amount obtained by substituting the calculated representative value and the calculated amount of variation into the estimation expression 350.

The quality judgment unit 325 judges, based on whether or not the estimated amount satisfies a predetermined condition, whether the variable resistance element 100 is non-defective or defective.

Next, an estimation method for the variable resistance element executed by the estimation device 300 having the above-described structure is described.

Figure 15:
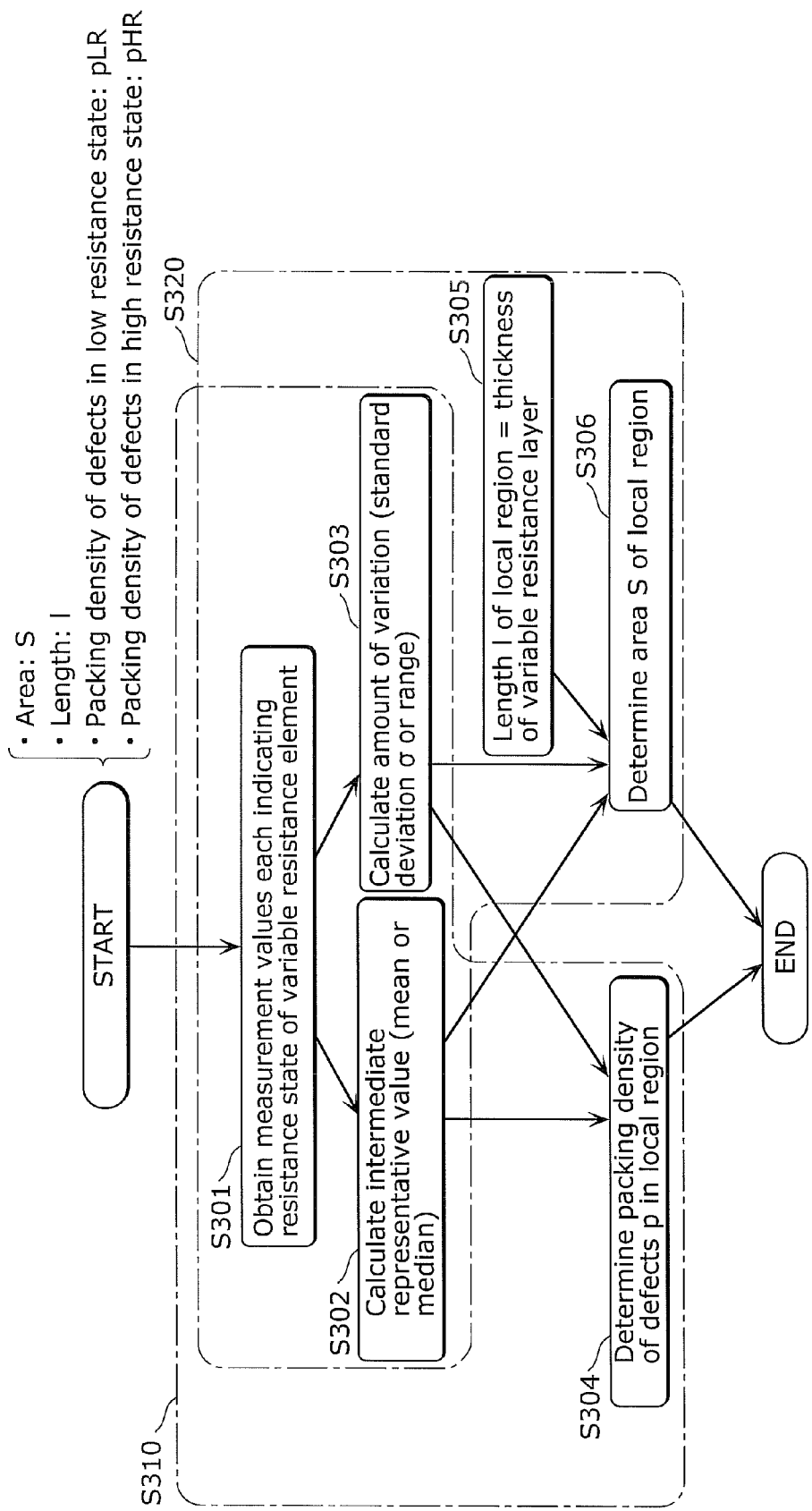
FIG. 15 is a flowchart showing an example of the estimation method for the variable resistance element according to Embodiment 2.

FIG. 15 is a flowchart showing an example of an estimation method for the variable resistance element according to Embodiment 2.

In the estimation method shown in FIG. 15, a step of determining an estimated amount of a packing density of defects p of the local region 105 (S310), and a step of determining an estimated amount of an area S of the local region 105 (S320) are executed. Note that, a part of Step S310 and a part of Step S320 are shared.

The measured distribution obtainment unit 323 obtains measurement values of the variable resistance element 100 in low resistance states and measurement values of the variable resistance element 100 in high resistance states. The obtained measurement values are measurement values at the time when pulse voltages of different polarities are applied to the variable resistance element 100 to perform low resistance programming operations and to perform high resistance programming operations alternately so that the variable resistance element changes to low resistance states and high resistance states. Each of the obtained measurement values is one of the measurement values of the variable resistance element 100 in one of the low resistance states and one of the high resistance states (S301). The obtained measurement values are stored as the measured distribution data 340 in the storage unit 201.

The estimated amount determination unit 324 calculates an intermediate representative value and an amount of variation for each of (i) measurement values obtained in law resistance states and (ii) measurement values obtained in high resistance states obtained in Step S301 (S302, S303). The estimated amount determination unit 324 may calculate, as the intermediate representative value, the mean or the median of the measurement values, and calculate, as the amount of variation, the standard deviation or a range (the difference between the largest value and the smallest value) of the measurement values.

The estimated amount determination unit 324 calculates a packing density of defects pLR in the local region 105 in a low resistance state and a packing density of defects pHR in the local region 105 in a high resistance state, by substituting the representative values and the amounts of variation that are calculated for each of (i) the low resistance state and (ii) the high resistance state into a predetermined estimation expression (S304).

The estimated amount determination unit 324 determines the length l of the local region to be the thickness of the variable resistance layer (Step S305). Here, the length l of the local region is determined to be (i) the thickness of a variable resistance layer 104 in the case where the variable resistance layer 104 of the variable resistance element 100 to be estimated has a single-layer structure (see FIG. 1), and (ii) the thickness of a second variable resistance layer 1042 in the case where the variable resistance layer 104 has a stacked structure (see FIG. 2). The thickness of the variable resistance layer which is determined to be the length l of the local region may be a designed value of the variable resistance element 100.

The estimated amount determination unit 324 calculates the area S of the local region 105 by substituting (i) the determined length l of the local region and (ii) the representative value and the amount of variation which are calculated for each of the low resistance state and the high resistance state into a predetermined estimation expression (Step S306).

With the execution of the above steps, the length l, the area S of the local region, the packing density of defects pLR in a low resistance state, and the packing density of defects pHR in a high resistance state are determined which are physical parameters regarding the structural characteristics of the local region.

Descriptions are further given on a specific example of the estimation expressions used in Steps S304 and S306.

An example of the measurement values of the variable resistance element 100 in the high resistance state and in the low resistance state are values of current that flows when a read voltage is applied to the variable resistance element 100 in the high resistance state and in the low resistance state respectively (hereinafter referred to as a read current values). The current value may contain an effect from a resistance component of a region which is connected in series to the local region 105 in the variable resistance element 100.

The area S of the local region 105 and the packing density of defects pLR in a low resistance state are obtained based on the read current values measured in the variable resistance element 100 in a low resistance state, using estimation expressions shown in Expression (3) and Expression (4).

[Math. 3]

$$S \propto \frac{l}{V_R} \sqrt{Iread \cdot \sigma\,read}, \quad \text{Expression (3)}$$
$$V_R = Vread - Rext \cdot Iread$$

$$pLR \propto \sqrt{\frac{Iread}{\sigma\,read}} \quad \text{Expression (4)}$$

Here, S denotes the area of the local region 105, l denotes the length of the local region 105, pLR denotes the packing density of defects in the local region 105 in a low resistance state, Vread denotes a read voltage, Iread represents the mean or the median of the read current of the variable resistance element 100 in a low resistance state, σread denotes the standard deviation of the read current of the variable resistance element 100 in a low resistance state, and Rext denotes a resistance component connected in series to the local region 105.

The area S of the local region 105 and the packing density of defects pHR in a high resistance state are calculated based on the read current values measured in the variable resistance element 100 in a high resistance state, using Expression (5) and Expression (6).

[Math. 4]

$$S \propto \frac{l}{V_R} \cdot \frac{\sigma\,read^2}{Iread}, \quad \text{Expression (5)}$$
$$V_R = Vread - Rext \cdot Iread$$

$$pHR \propto \left(\frac{Iread}{\sigma\,read}\right)^2 \quad \text{Expression (6)}$$

Here, S denotes the area of the local region 105, l denotes the length of the local region 105, pHR denotes the packing density of defects in the local region 105 in a high resistance state, Vread denotes the read voltage, Iread represents the mean or the median of the read current of the variable resistance element 100 in a high resistance state, σread denotes the standard deviation of the read current of the variable resistance element 100 in a high resistance state, and Rext denotes a resistance component of a region connected in series to the local region 105.

Note that, the area S and the length l of the local region 105 are the same in both low resistance state and high resistance state, and thus the area S of the local region 105 may be determined using one of Expression (3) and Expression (5).

Furthermore, in Expressions (3) to (6), a range that is a difference between the largest value and the smallest value of the read current may be used instead of the standard deviation σ of the read current.

Figure 16:
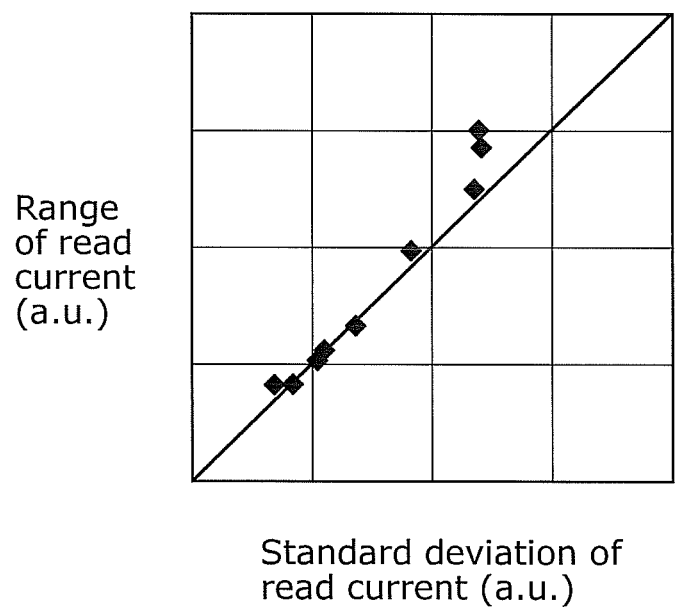
FIG. 16 is a graph showing a relationship between the standard deviation and a range of read current.

FIG. 16 is a graph showing a relationship between the standard deviation of the read current measured in the variable resistance element 100 and the range of the read current. A significantly close correlation is observed between the standard deviation and the range of the read current. Thus, even when the range of the read current is used instead of the standard deviation σ in Expressions (3) to (6), a substantially the same estimated amount can be obtained as the case where the standard deviation σ is used.

The inventors of the present application conducted an experiment in which a sample of an actually fabricated variable resistance element 100 is estimated according to the above-described estimation method. The following describes the experiment.

In the experiment, the resistive status of the sample of the variable resistance element 100 is changed under two types of programming conditions, and the estimated amount of the physical parameter of the local region 105 of the sample is determined under each of the programming conditions. The length l of the local region 105 of the sample equals to the thickness of the variable resistance layer and is 6.5 nm.

First, pulse voltages of different polarities are applied to the sample (−2.4 V, +2.4 V: a first programming condition) to perform low resistance programming operations and high resistance programming operations 100 times alternately so that the variable resistance element takes low resistance states and high resistance states 100 times. In this process, the read current value of the sample is measured in each of the low resistance states and in each of the high resistance states.

Figure 17A:
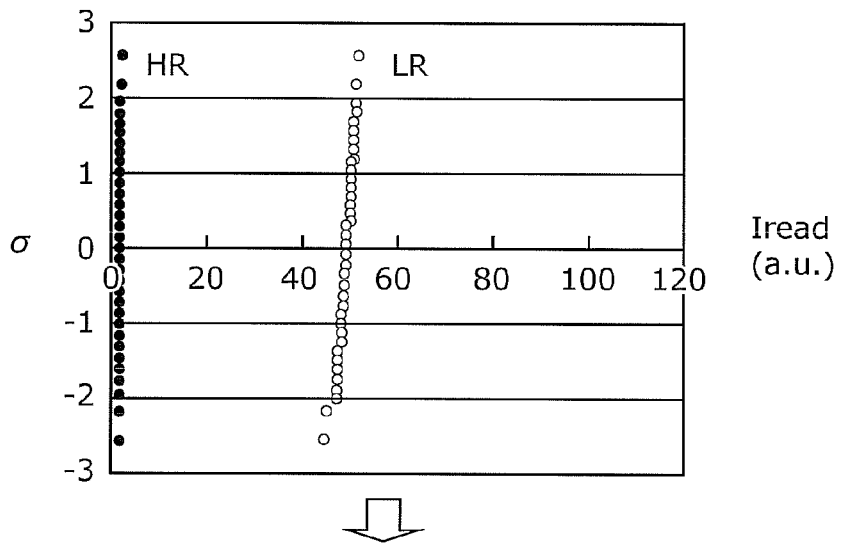
FIG. 17A is a diagram showing (i) a normal probability plot which shows an example of a measured distribution of a current actually measured using a sample of the variable resistance element and (ii) an example of estimated amounts determined based on the measured distribution.

FIG. 17A shows a normal probability plot which shows an example of a measured distribution of current values actually measured using the sample and the area S of the local region 105, the packing density of defects pLR in a low resistance state, and the packing density of defects pHR in a high resistance state which are calculate according to Expression (3), Expression (4), and Expression (6) based on the measured distribution of the current values. The current value is represented with an arbitrary unit.

Furthermore, pulse voltages of different polarities are applied to the sample (−2.8 V, +2.2 V: a second programming condition) to perform low resistance programming operations and high resistance programming operations 100 times alternately so that the variable resistance element takes low resistance states and high resistance states 100 times. In this process, the read current value of the sample is measured in each of low resistance states and in each of high resistance states.

Figure 17B:
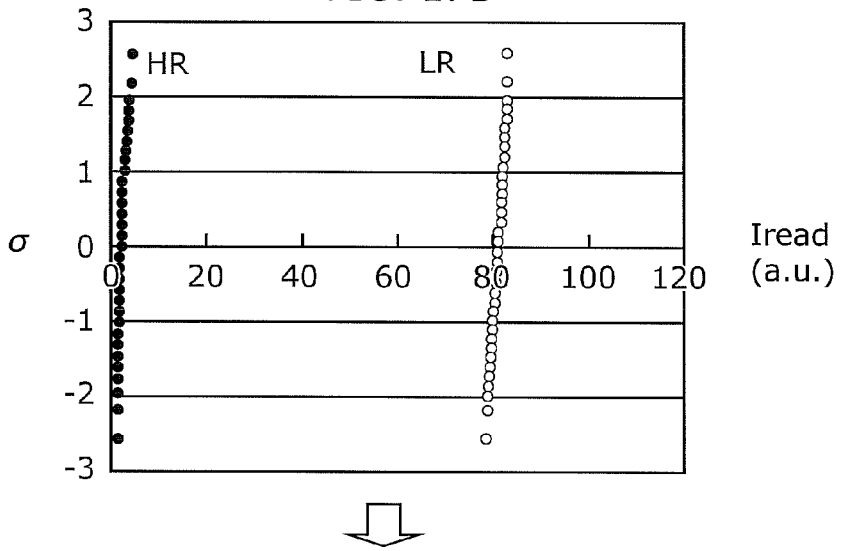
FIG. 17B is a diagram showing (i) a normal probability plot which shows an example of a measured distribution of a current actually measured using a sample of the variable resistance elements and (ii) an example of estimated amounts determined based on the measured distribution.

FIG. 17B shows a normal probability plot which shows an example of a measured distribution of current values actually measured using the sample and the area S of the local region 105, the packing density of defects pLR in a low resistance state, and the packing density of defects pHR in a high resistance state which are calculate according to Expression (3), Expression (4), and Expression (6) based on the measured distribution of the current values. The current value is represented with an arbitrary unit.

From FIG. 17A and FIG. 17B, estimated amounts in which the area S of the local region 105, and packing densities of defects pLR and pHR are different are obtained by performing programming under different programming conditions on the same sample. This indicates that, with the above-described estimation method, the difference in the programming conditions are reflected to the different estimated amounts of the physical parameter.

As described above, according to the estimation method and estimation device for the variable resistance element according to Embodiment 2, the estimated amount of the physical parameter regarding structural characteristics of the local region 105 of the variable resistance element 100 can be determined from the distribution of the measurement values each indicating a resistance state after one of changes made to the resistive status of the variable resistance element 100.

The measurement value is obtained in a state where resistive status of the local region 105 can be changed a plurality of times, that is, without destroying the variable resistance element 100. Thus, even after the variable resistance element 100 is incorporated into a product such as the nonvolatile memory device or the like, the estimated amount can be determined in a state where the variable resistance element is incorporated in the product, without destroying the variable resistance element and without preparing a special sample of the variable resistance element for estimation.

The determined estimated amount can be used, for example, for judgment of quality or screening of the variable resistance element 100.

For example, the quality judgment unit 325 can judge that the variable resistance element 100 having physical parameters with estimated amount that does not satisfy a predetermined condition is defective. Then, screening the variable resistance element 100 which is judged to be defective makes it possible to improve a yield and reliability of a product which includes the variable resistance element 100. The judgment of quality and screening of the variable resistance element 100 will be described later in detail.

Embodiment 3

7. Reliability Estimation of Variable Resistance Element Based on Estimated Amount of Physical Parameter An estimation method for the variable resistance element according to Embodiment 3 is described. The estimation method according to Embodiment 3 is a method in which reliability regarding resistance changing operation of the variable resistance element 100 is estimated using an estimated amount of a physical parameter of the local region 105.

The following describes, as an example of the method for estimating the reliability of the variable resistance element 100, a method in which whether the variable resistance element 100 is non-defective or defective is judged based on whether or not the estimated amount of the physical parameter of the local region 105 satisfies a predetermined condition.

First, a criterion for judging whether the variable resistance element 100 is non-defective or defective is described. The criterion described below is an example, which is found by experiments conducted by the inventors of the present application.

In one of the experiments, samples of the variable resistance elements 100 are changed into low resistance states and high resistance states a plurality of times under various programming conditions, and an estimated amount of a packing density of defects pLR in the low resistance state and an estimated amount of a packing density of defects pHR in the high resistance state are determined according to the above-described estimation method for each of the samples. After this, all the samples are changed to the low resistance state, and then are left in a high temperature environment of 175 degrees Celsius for 50 hours. The read current values before and after being left are used to calculate a retention deterioration rate=(read current value before being left−read current value after being left)/read current value before being left. The retention deterioration rate indicates a retention characteristic of a corresponding one of the samples in a low resistance state.

FIG. 18A is a scattering chart showing an example of dependency of retention deterioration rates of samples in low resistance states on the packing density of defects pLR in low resistance state and the packing density of defects pHR in high resistance state. The samples having retention deterioration rates higher than or equal to a predetermined threshold (e.g., 30 percent) is indicated by crosses, and the samples having retention deterioration rates smaller than the threshold is indicated by circles.

These results indicate that the variable resistance element 100 having an estimated amount of the packing density of defects pLR in a low resistance state and an estimated amount of the packing density of defects pHR in a high resistance state which satisfy a predetermined condition (in FIG. 18A, positioned in a region on a left bottom corner formed by a diagonal line) has increased probability that such a variable resistance element 100 has a retention deterioration rate higher than or equal to the threshold and thus has a decreased reliability in retaining data.

Furthermore, in another one of the experiments, samples of the variable resistance elements 100 are changed into low resistance states and high resistance states a plurality of times under various programming conditions, and the estimated amount of the packing density of defects pLR in the low resistance state and the estimated amount of the packing density of defects pHR in the high resistance states are determined according to the above-described estimation method for each of the samples. Then, all the variable resistance elements 100 are changed into high resistance states, and reading is performed consecutively a plurality of times to measure a current value every time. The range of the read current (difference between the largest value and the smallest value) is thus calculated.

FIG. 18B is a scattering chart showing an example of dependency of the range of the read current of samples in the high resistance state on the packing density of defects pLR in the low resistance state and the packing density of defects pHR in the high resistance state. The samples having ranges of the read current higher than or equal to a predetermined threshold (e.g., 5 μA) are indicated by crosses, and the samples having ranges of the read current smaller than the threshold are indicated by circles.

These results indicate that the variable resistance element having an estimated amount of the packing density of defects pHR in a high resistance state which satisfies a predetermined condition (in FIG. 18B, positioned in a region on an upper side relative to the horizontal line) has increased probability that the range of the read current in a high resistance state of such a variable resistance element becomes greater than or equal to the threshold in the read current value in a high resistance state and thus has a decreased reliability in reading data in a high resistance state.

These experiments show that the reliability regarding resistance changing operation of the variable resistance element 100 can be predicted from the estimated amount of the physical parameter regarding the structural characteristics of the local region 105 and it is possible to judge, based on the prediction, whether the variable resistance element 100 is non-defective or defective (latent failure is also taken into account).

In view of this, the quality judgment unit 225 and the quality judgment unit 325 in the estimation devices 200 and 300 shown in FIGS. 8 and 14 respectively judges whether the variable resistance element 100 is non-defective or defective, based on whether or not the estimated amount of the physical parameter of the local region 105 satisfies a predetermined condition. Each of (i) the condition of the packing densities of defects pLR and pHR with which the retention deterioration rate becomes greater than or equal to a predetermined threshold (e.g., 30 percent) (FIG. 18A), and (ii) the condition of the packing densities of defects pLR and pHR with which the range of the read current becomes greater than or equal to a predetermined threshold (e.g., 5 μA) (FIG. 18B) described above is an example of the predetermined condition.

Performing such a judgment of quality before or during the use of the variable resistance element 100 makes it possible to detect in advance the variable resistance element 100 which can cause error in operation in the future.

Note that, although the variable resistance element 100 is judged non-defective or defective by comparing the retention deterioration rate in a low resistance state and the range of the read current in a high resistance state with their respective single threshold values in the above, the present disclosure is not limited to this example.

For example, use of a plurality of threshold values makes it possible to grade the variable resistance element 100 according to reliability regarding a resistance changing operation. In other words, the above-described estimation method enables not only a judgment of quality of the variable resistance element 100 but also quantitative estimation of the reliability of the variable resistance element 100 in more detail.

Furthermore, the retention deterioration rate in a low resistance state and the range of the read current described above are examples. According to the estimation method described above, the reliability of the variable resistance element 100 can be quantitatively estimated based on any variables which represent reliability of the variable resistance element 100 regarding the resistance changing operation and depend on the estimated amount of the physical parameter of the local region 105.

Furthermore, in the above-described estimation method, the source of the estimated amount of the physical parameter of the local region 105 is not limited. More specifically, the estimated amount is not limited to the estimated amount determined by the calculation based on the distribution of measurement values of the resistive status of the variable resistance element 100 but may be, for example, an estimated amount obtained from a separately provided device. Thus, an estimation method which includes an obtainment step of obtaining an estimated amount of a physical parameter regarding structural characteristics of the local region; and a judgment step of judging whether the variable resistance element is non-defective or defective based on whether or not the obtained estimated amount of the physical parameter satisfies a predetermined condition is intended to be included within the scope of the present disclosure.

8. Screening of Variable Resistance Element

Embodiment 4

A method for screening a variable resistance element according to Embodiment 4 is described. The screening method according to Embodiment 4 is a method in which a variable resistance element which has been judged to be defective according to an estimation method according to Embodiment 3 is modified or excluded from use.

The screening method is executed, for example, by an inspection device which is for inspecting the variable resistance element or a nonvolatile memory device which includes a plurality of variable resistance elements and has a BIST function. The inspection device or the nonvolatile memory device may include an estimation device 200 or an estimation device 300 or may obtain, from the estimation device 200 or the estimation device 300 which is provided as a separate unit, a result of judgment of quality indicating whether the variable resistance element is non-defective or defective, to perform the screening.

Figure 19:
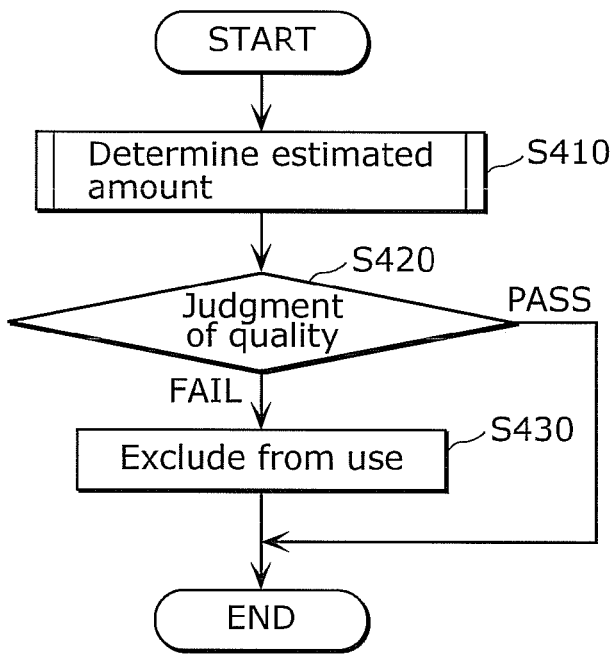
FIG. 19 is a flowchart showing an example of an estimation method for a variable resistance element according to Embodiment 3.

FIG. 19 is a flowchart showing an example of the screening method of the variable resistance element according to Embodiment 4. The screening method shown in FIG. 19 can be performed, for example, by the inspection device or the nonvolatile memory device which has a BIST function at any time such as when the variable resistance element is inspected or in use.

First, an estimated amount is determined according to the flowchart shown in FIG. 9 or FIG. 15 (S410).

Next, whether the variable resistance element 100 is non-defective or defective is judged based on whether or not the estimated amount determined in Step S410 satisfies a predetermined condition (S420). The judgment of Step S420 may be performed according to, for example, conditions described for FIG. 18A and FIG. 18B.

The variable resistance element 100, which is judged to be defective (FAIL in S420), is excluded from use (S430). A process for excluding the variable resistance element 100 from use may be performed, for example, by a so-called relief process in which a replacement with a redundant variable resistance element provided in advance is performed.

Figure 20:
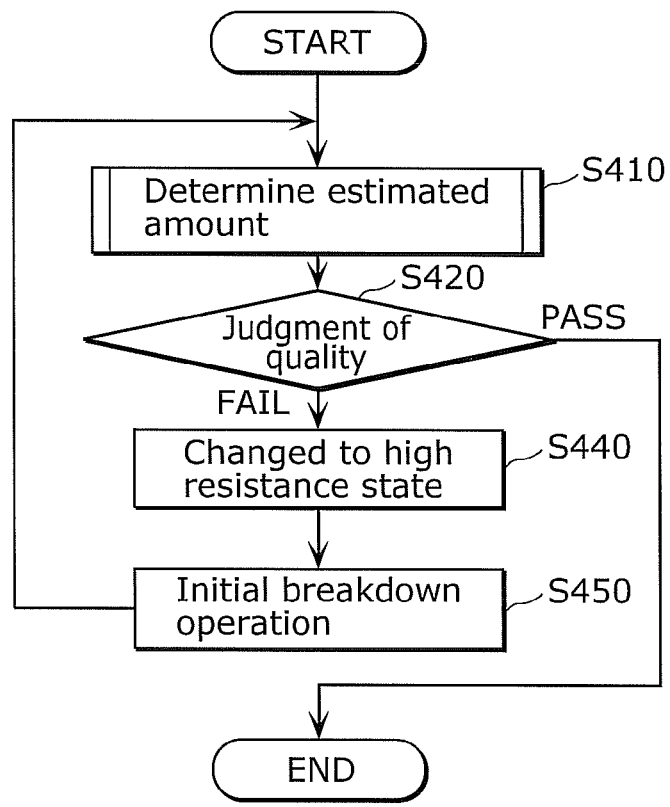
FIG. 20 is a flowchart showing another example of the estimation method for the variable resistance element according to Embodiment 3.

FIG. 20 is a flowchart showing another example of the screening method of the variable resistance element according to Embodiment 4. The screening method shown in FIG. 20 can be performed, for example, by the inspection device or the nonvolatile memory device which has the BIST function at any time such as when the variable resistance element is inspected or in use.

First, the estimated amount is determined in a similar manner as FIG. 19 (S410), and whether the variable resistance element 100 is non-defective or defective is judged based on the determined estimated amount (S420).

When the variable resistance element 100 is judged to be defective (FAIL in S420), a programming voltage having a higher voltage than a normal high resistance programming voltage is applied to the variable resistance element 100 to change the resistive status of the variable resistance element 100 into a resistance state close to the initial state having an even higher resistance value than a normal high resistance state (S440). After this, an initial breakdown operation is performed in which the same voltage as the initial breakdown voltage is applied, and the structure of the local region 105 is thus modified (S450).

After the initial breakdown operation, the estimated amount is determined again, and the high resistance programming and the initial breakdown operation are repeatedly performed until the variable resistance element 100 is judged to be non-defective ("PASS" in S420). The variable resistance element 100 may be excluded from use according to Step S430 in FIG. 19, when the variable resistance element 100 is judged to be defective even when the initial breakdown operation is repeated a predetermined number of times.

As described above, according to the screening method of the variable resistance element according to Embodiment 4, the variable resistance element judged to be defective is modified or excluded from use. This makes it possible to increase a yield and reliability of a product which includes the variable resistance element.

9. Nonvolatile Memory Device

Embodiment 5

An estimation method and an estimation device for the variable resistance element according to Embodiment 5 are described based on FIG. 21 to FIG. 25.

Embodiment 5 describes a nonvolatile memory device including a BIST function (hereinafter simply referred to as a memory device) realized by using an estimation method and an estimation device for the variable resistance element according to Embodiment 1 or 2.

The BIST function according to Embodiment 5 is a self-test function of the memory device and includes execution of (i) an operation for a judgment in which whether the variable resistance element is non-defective or defective is judged and (ii) a relief operation in which the variable resistance element judged to be defective is replaced with a redundant variable resistance element.

Figure 21:
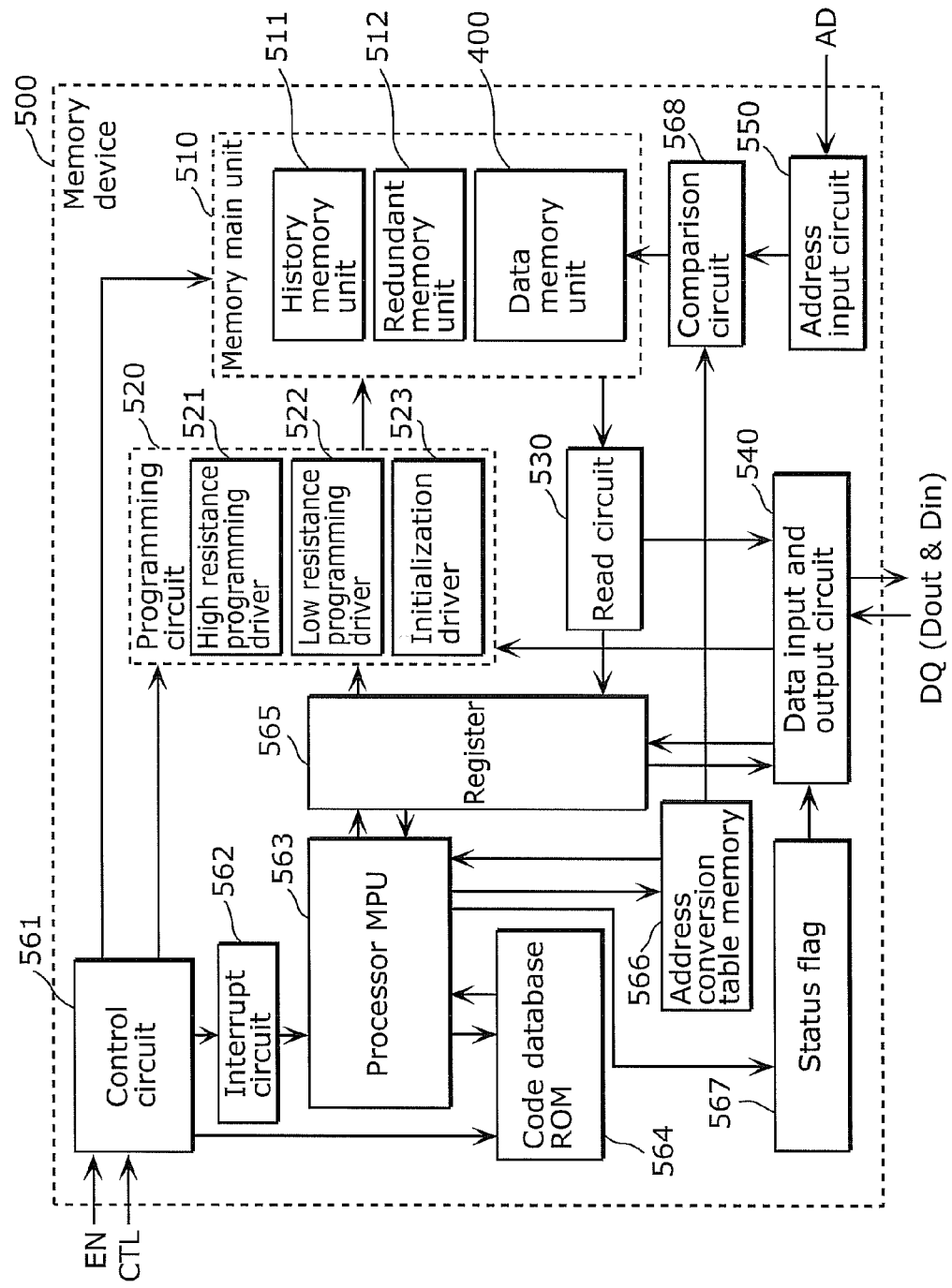
FIG. 21 is a block diagram showing an example of a structure of a memory device including a built-in self test (BIST) function.

First, a structure of a memory device according to Embodiment 5 is described based on FIG. 21. FIG. 21 is a block diagram showing a structure of the memory device according to Embodiment 5.

As shown in FIG. 21, a memory device 500 according to Embodiment 5 includes: a memory main unit 510, a programming circuit 520, a read circuit 530, a data input and output circuit 540, an address input circuit 550, a control circuit 561, an interrupt circuit 562, a processor 563, a code database 564, a register 565, an address conversion table memory 566, a status flag 567, and a comparison circuit 568.

The memory main unit 510 includes, as three memory units, a history memory unit 511, a redundant memory unit 512, and a data memory unit 400.

Figure 22:
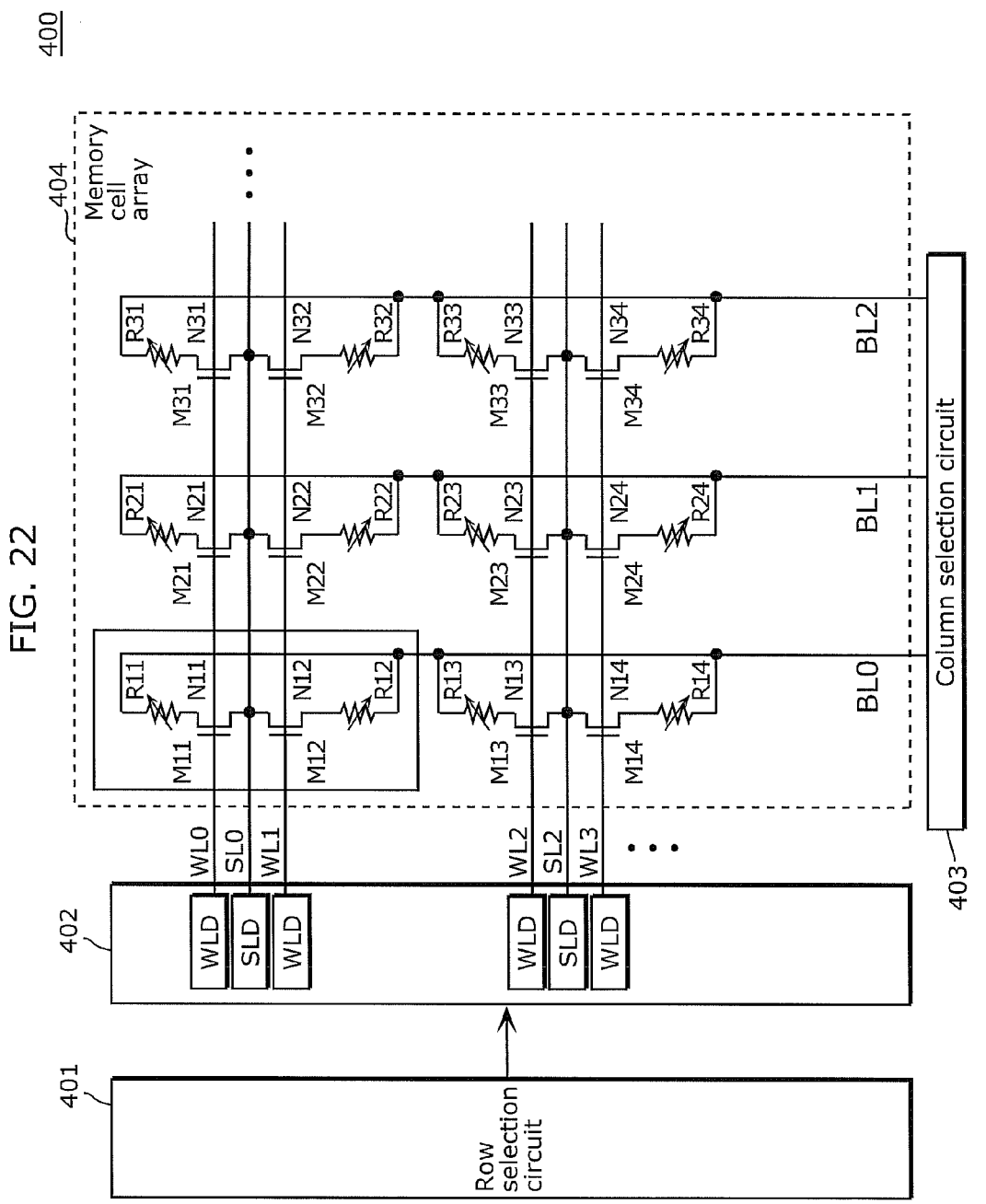
FIG. 22 is a block diagram showing an example of a structure of a data array provided in the memory device.

FIG. 22 shows a structure of the data memory unit 400. The data memory unit 400 includes, as shown in FIG. 22, a row selection circuit 401, a driver circuit 402, a column selection circuit 403, and a memory cell array 404 which includes a plurality of memory cells $M_{ij}$ (each of i and j is an integer) arranged in rows and columns.

The memory cell $M_{ij}$ includes a variable resistance element $R_{ij}$, and a switch element $N_{ij}$ which includes an N-type MOS transistor having a drain terminal connected to one end of the variable resistance element $R_{ij}$.

Furthermore, the data memory unit 400 includes, for every row, a word line $WL_{(j-1)}$ connected to a gate terminal of a transistor $N_{ij}$ of a memory cell $M_{ij}$ in the same row. The data memory unit 400 includes, for every two rows, a source line $SL_{(j-1)}$ which is connected to source terminals of transistors $N_{ij}$ and $N_{i(j+1)}$ (here, j is an even number) of memory cells $M_{ij}$ and $M_{i(j+1)}$ (here, j is an even number) in the two rows.

Furthermore, the data memory unit 400 includes, for every column, a bit line $BL_{(i-1)}$ which is connected to one end of the variable resistance element $R_{ij}$ of a memory cell $M_{ij}$ in the same column. More specifically, a memory cell $M_{ij}$ is provided at a cross-point of a word line $WL_{(j-1)}$ and a bit line $BL_{(i-1)}$.

The driver circuit 402 includes: a word line driver WLD which generates a voltage applied to a word line WL; and a source line driver SLD which generates a voltage applied to a source line SL.

The row selection circuit 401 receives a row address signal output from the comparison circuit 568, and applies, to the word line $WL_k$ (k is an integer) which corresponds to the row address signal, a predetermined voltage via the word line driver WLD. In a similar manner, the row selection circuit 401 applies, to the source line $SL_h$ (h is an integer) which corresponds to the row address signal output from the comparison circuit 568, a predetermined voltage via the source line driver SLD.

The column selection circuit 403 receives the row address signal output from the comparison circuit 568, and applies a predetermine voltage to the bit line $BL_l$ (l is an integer) which corresponds to the row address signal.

Note that, each of the history memory unit 511 and the redundant memory unit 512 has a structure which is basically the same as the structure of the data memory unit 400 except that the number of the memory cells may differ.

The control circuit 561 controls each of the functions included in the memory device 500. In Embodiment 5, the control circuit 561 causes the processor 563 to perform a corresponding function in response to a BIST enable signal EN, a control signal CTL, and the like which are input from the outside. More specifically, the control circuit 561 provides, to the processor 563, an instruction notifying the address (start address) where a program that indicates a processing procedure of a corresponding one of the functions is stored in the code database 564. The BIST operation here includes: a screening of the variable resistance element in the data memory unit 400; and an operation of replacing a memory cell including the variable resistance element which has been judged to be defective with a memory cell in a redundant cell array.

The processor 563 executes the various operations by sequentially reading codes from the address (test start address) of the code database 564 instructed by the control circuit 561. For example, when the address of a program which defines the BIST operation is designated, the processor 563 performs the BIST operation. The various operations include the initial breakdown operation, the programming operation, and the read operation.

In the programming operation, the processor 563 writes in the register 565 an address and data in the programming operation. At this time, the programming circuit 520 performs the programming operation based on the address and the data written in the register 565.

Furthermore, in the read operation, the processor 563 writes in the register 565 the address in the programming operation. At this time, the read circuit 530 reads data from the data memory unit 400 based on the address written in the register 565, and writes the data in the register 565. In the initial breakdown operation, the processor 563 writes in the register 565 the address in the initial breakdown operation. At this time, the programming circuit 520 performs the initial breakdown operation based on the address written in the register 565.

The programming circuit 520 includes: a high resistance programming driver 521 which generates a voltage used in a high resistance programming operation; and a low resistance programming driver 522 which generates a voltage used in a low resistance programming operation; and an initialization driver 523 which generates a voltage used in the initial breakdown operation.

The read circuit 530 determines a value written in the memory cell based on a value of a current which flows in the memory cell. Note that, in a normal read operation, it is sufficient for the read circuit 530 in Embodiment 5 to determine whether the resistive status is a low resistance state or a high resistance state, and thus the read circuit 530 compares the read current value with a single threshold value (or compare values that are converted into voltages). The read circuit 530 is configured to be capable of obtaining a precise resistance value, for example, to perform comparison with a plurality of threshold values in the BIST operation.

The data input and output circuit 540 performs input and output processing of input data and output data through a terminal DQ.

The address input circuit 550 receives the address signal input from the outside.

Figure 23:
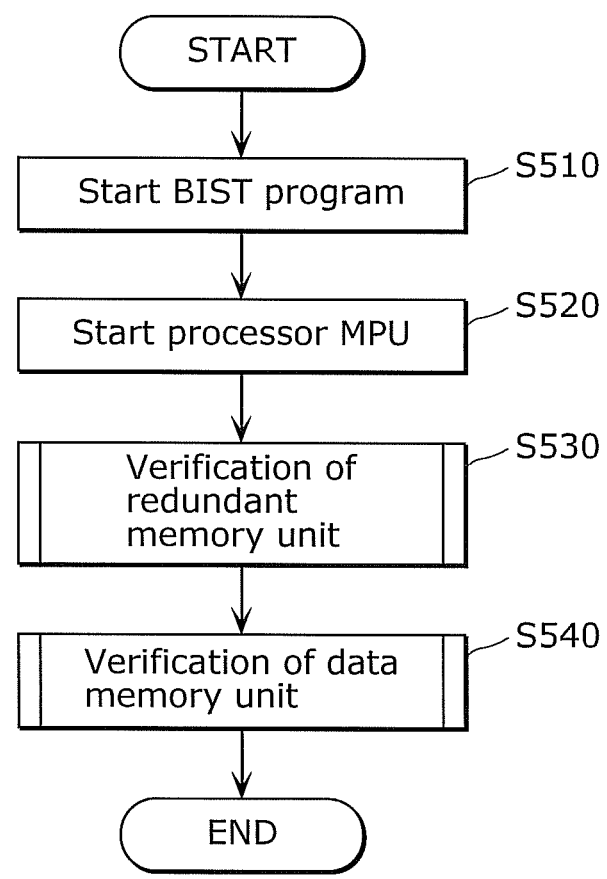
FIG. 23 is a flowchart showing an example of BIST operations in the memory device.
Figure 24:
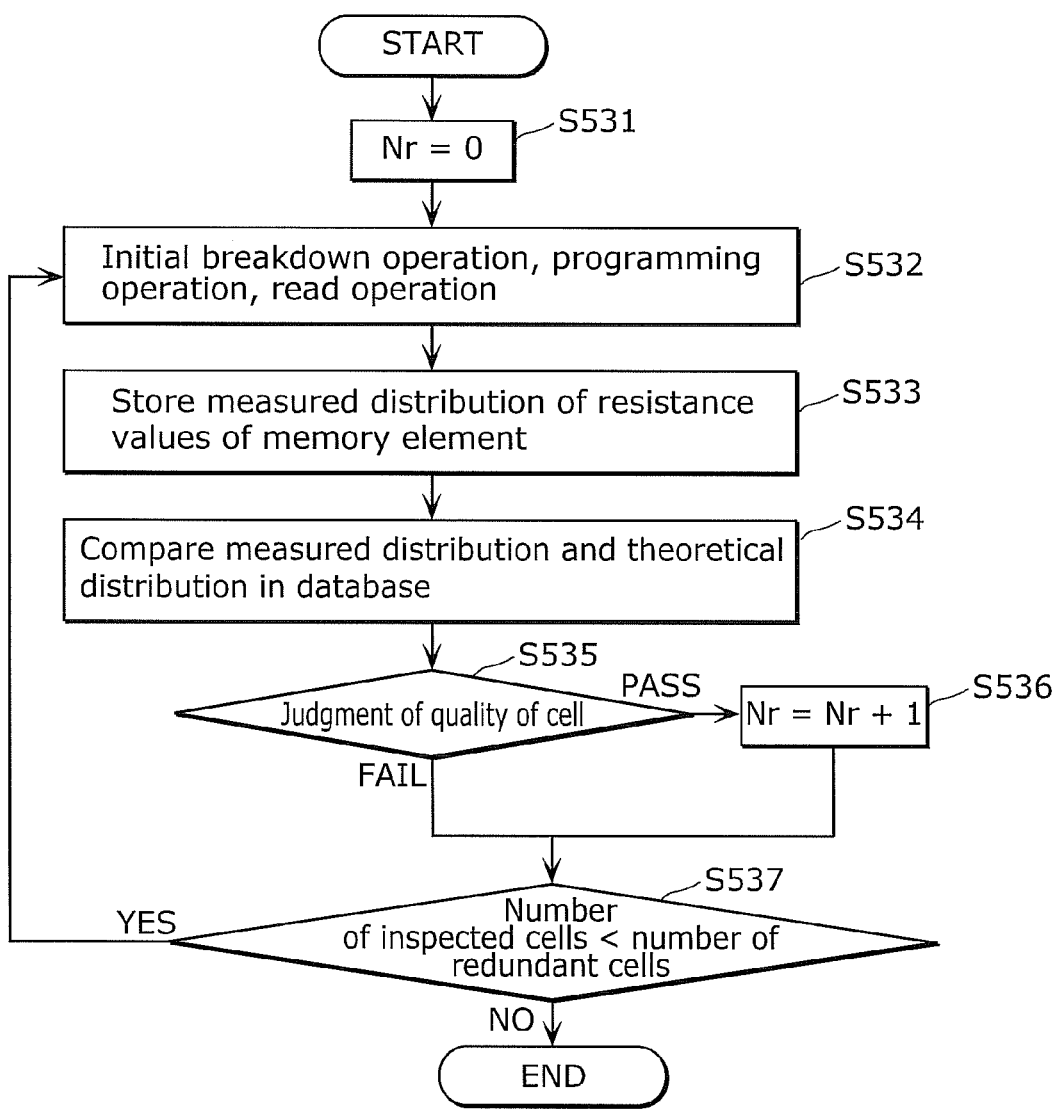
FIG. 24 is a flowchart showing an example of the BIST operations in the memory device.
Figure 25:
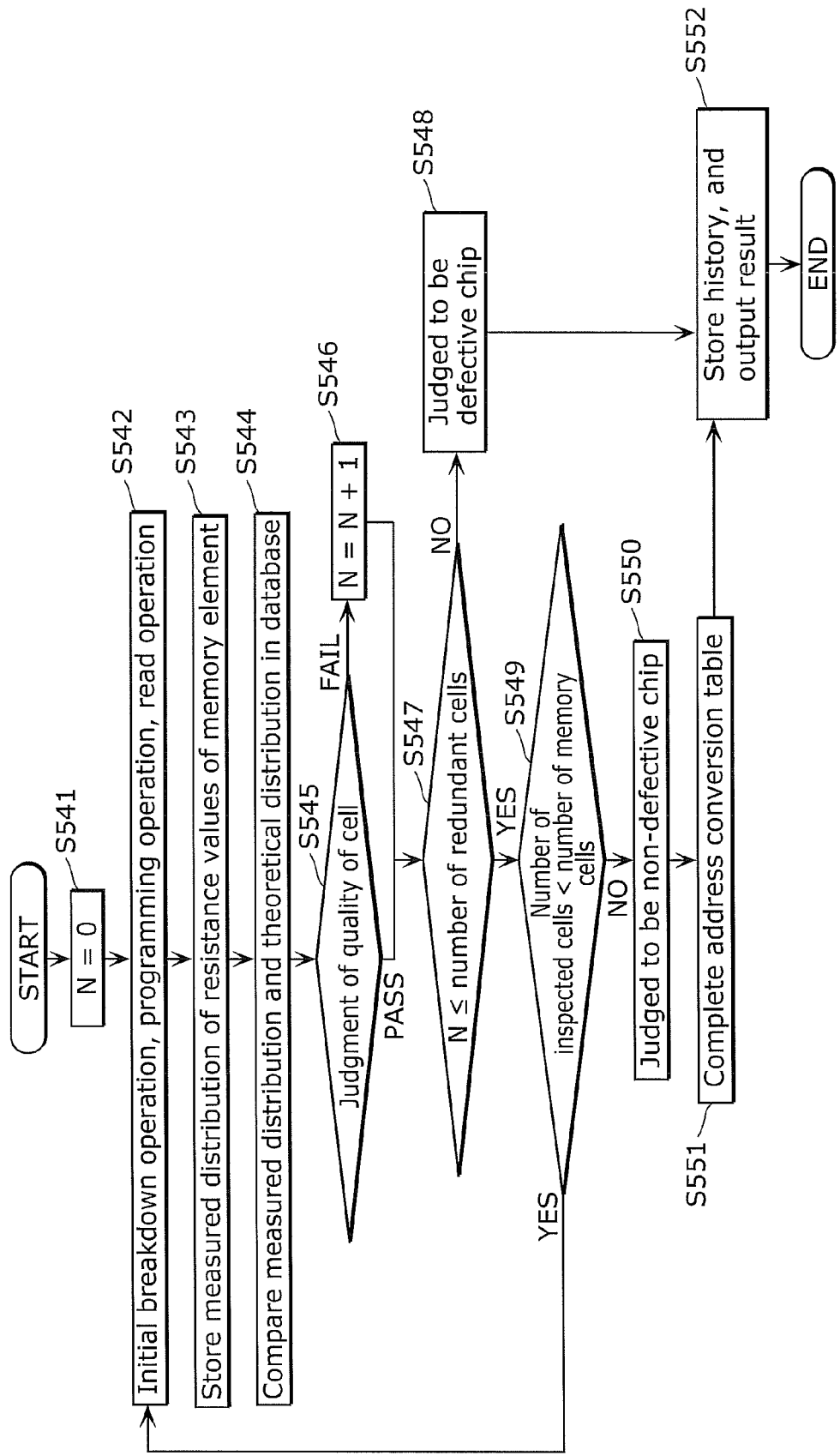
FIG. 25 is a flowchart showing an example of the BIST operations in the memory device.

Next, the BIST operation (judgment of quality after the initialization) in Embodiment 5 is described based on FIGS. 23 to 25. FIG. 23 is a flowchart showing a processing procedure of the BIST operation performed by the memory device 500.

After the fabrication of the memory device 500, when receiving a BIST enabling signal EN from the outside, the control circuit 561 of the memory device 500 outputs an interrupt request including a start address of a program which defines the BIST operation to the processor 563 via the interrupt circuit 562, as shown in FIG. 23 (S510).

The processor 563 sequentially reads, from the address designated in the interrupt request, instructions stored in the code database 564 (S520).

The processor 563 initially determines, for a redundant cell, an estimated amount of the physical parameter of a local region to judge whether the redundant cell is non-defective or defective, to count the number of available redundant cells (S530).

The processor 563 then determines, for the memory cell of the data memory unit 400, an estimated amount of the physical parameter of the local region to judge whether the memory cell is non-defective or defective. Furthermore, the processor 563 judges a chip to be a non-defective chip when the number of defective cells that have been judged to be defective is smaller than the number of the available redundant cells, and judges a chip to be a defective chip when the number of defective cells that have been judged to be defective is larger than the number of the available redundant cells, and outputs the result of the judgment to the outside as a BIST result (S540).

Verification of the redundant cell in Step S530 is described based on FIG. 24. FIG. 24 is a flowchart showing a processing procedure of verification of a redundant cell.

The processor 563 sets a count Nr of a counter to 0. The count Nr corresponds to the number of available redundant cells (S531).

The processor 563 performs the initial breakdown operation for the redundant cell by using the programming circuit 520. With this, a local region is formed in the variable resistance element of the redundant cell, enabling the resistive status to be changed between a high resistance state and a low resistance state. After this, a negative voltage pulse and a positive voltage pulse for programming are alternately applied to the redundant cell, and the resistance value of the variable resistance element after each of the programming operations is stored in the register 565 according to the resistive status (i.e., according to the high resistance state and the low resistance state) (S532).

The processor 563 calculates parameters of the logarithmic normal distributions each representing one of (i) the measured distribution of the actually measured resistance values of the redundant cell in the high resistance state and (ii) the measured distribution of the actually measured resistance values of the redundant cell in the low resistance state, and stores the result in the register 565 (S533).

The processor 563 compares, with a corresponding database of theoretical distributions created in advance (plural pieces of the theoretical distribution data 230 in FIG. 7), the measured distribution in the high resistance state and the measured distribution in the low resistance state obtained in Step S533, to determine the estimated amount of the physical parameter of the local region (S534). The processing in this step is the same as Step S230 in FIG. 9.

The processor 563 judges whether or not the estimated amount of the physical parameter of the local region obtained in Step S534 falls within a predetermined reference range (S535). When the estimated amount of the physical parameter of the local region falls within the reference range, the processor 563 judges the redundant cell to be an available redundant cell ("PASS" in S535), and increment the count Nr of the counter by one (S536). The processor 563 stores, in the address conversion table memory 566, the address of the redundant cell which has been judged in Step S535 to be defective.

The processor 563 judges whether the number of the inspected redundant cells is smaller than the number of the redundant cells of the redundant memory unit 512 (S537), and performs, for the next redundant cell, processing of Step S532 to Step S536 when the number is smaller.

The processor 563 stores, after the completion of inspection of all the redundant cells, the count Nr of the counter as the number of available redundant cells.

The verification of a data memory unit in Step S540 is described based on FIG. 25. FIG. 25 is a flowchart showing a processing procedure of verification of a memory cell of the data memory unit 400.

The processor 563 sets the count N of the counter to 0 (S541). The count N corresponds to the number of memory cells which is judged to be defective (hereinafter, where necessary, referred to as a "defective cell").

The processor 563 performs the initial breakdown operation by using the programming circuit 520. With this, a local region is formed in the variable resistance element $R_{ij}$ of a memory cell $M_{ij}$, and the resistive status becomes changeable between the high resistance state and the low resistance state. After this, a negative voltage pulse and a positive voltage pulse for programming are alternately applied to the memory cell $M_{ij}$, and the resistance value of the variable resistance element $R_{ij}$ after each of the programming operations is stored in the register 565 according to the resistive status (i.e., according to the high resistance state and the low resistance state) (S542).

The processor 563 calculates parameters of the logarithmic normal distributions each of which indicates one of (i) the measured distribution of the actually measured resistance values in the high resistance state and (ii) the measured distribution of the actually measured resistance values in the low resistance state, and stores the result in the register 565 (S543).

The processor 563 compares, with a database of theoretical distributions created in advance, the measured distribution in the high resistance state and the measured distribution in the low resistance state obtained in Step S543, to determine the estimated amount of the physical parameter of the local region (S544). The processing in this step is the same as Step S230 in FIG. 9.

The processor 563 judges whether or not the estimated amount of the physical parameter of the local region obtained in Step S544 falls within a predetermined reference range (S545). When the estimated amount of the physical parameter of the local region falls outside the reference range, the processor 563 judges the memory cell to be defective ("FAIL" in S545), and increment the count N of the counter by one (S546). The processor 563 stores in the address conversion table memory 566 an address of a memory cell which is judged to be defective in Step S545.

The processor 563 judges, when the memory cell $M_{ij}$ is judged to be non-defective in Step S545 or when the count is updated in Step S546, whether the number of the defective cells (=N) judged to be defective is smaller than the number of the available redundant cells (=Nr) (S547).

When the number of the defective cells N is greater than the number of the redundant cells Nr in S547 ("NO" in Step S547), there is an unrelievable memory cell, and thus the processor 563 judges a chip to be a defective chip (S548). At this time, the processor 563 writes in the status flag 567 fail information (Status=Fail) as the result of the BIST.

The processor 563 determines, when the number of the defective cells N is determined to be smaller than the number of the available redundant cells Nr in Step S547 ("YES" in S547), whether or not the number of the inspected memory cells is smaller than the number of the memory cells of the data memory unit 400 (S549).

When judging that the number of the memory cells inspected is smaller than the number of the memory cells of the data memory unit 400 in Step S549 ("YES" in S549), the processor 563 performs the processing of Step S542 to Step S547 for the memory cell yet to be inspected.

The processor 563 determines, when judging that the number of the memory cells inspected is greater than or equal to the number of the memory cells of the data memory unit 400 in Step S549 ("NO" in Step S549) that is when determining that all the memory cells in the data memory unit 400 have been inspected, a chip to be a non-defective chip (S550). At this time, the processor 563 writes in the status flag 567 pass information (Status=Pass) as the result of the BIST.

The processor 563 generates, when the chip is judged to be non-defective chip in Step S550, a conversion table which associates the address of the defective cell of the data memory unit 400 and the address of the available redundant cell to relieve the defective cell, and stores the conversion table in the address conversion table memory 566 (S551).

The processor 563 writes, in the history memory unit 511, the Pass/Frail result of the BIST wrote in the status flag 567 and information of unavailable/available of each of the redundant cells of the redundant memory unit 512 (S552).

Note that, these test result information and fail address information are, after the execution of the test, output via the data input and output circuit 540 and monitored by an external integrated circuit (IC) tester or the like. The generation of a fail category and analysis of a yield can be easily performed by reading the data stored in the history memory unit 511.

Furthermore, it is possible that the defective cell is generated not only right after the fabrication (right after the performance of the initial breakdown operation) but also after a shipment of a product. Thus, the BIST (e.g., a memory diagnosis) may be configured to be executed as necessary. Operations performed for the memory diagnosis are the operations performed for the screening described above but does not include the initial breakdown operation.

As described above, in Embodiment 5, the BIST of the memory device is configured by using an estimation method and an estimation device for the variable resistance element according to Embodiment 3. As described above, with the use of the estimation method and the estimation device for the variable resistance element according to Embodiment 3, quantification of the physical parameter of the local region 105 of each of the variable resistance elements 100 included in the memory device can be achieved in a state being incorporated in a product.

In Embodiment 5, the estimation method and the estimation device for the variable resistance element according to Embodiment 3 are used for the BIST and the screening. Thus, the function of the BIST or the like can be easily realized.

10. Variation

The herein disclosed subject matter is to be considered descriptive and illustrative only, and the appended Claims are of a scope intended to cover and encompass not only the particular embodiments disclosed, but also equivalent structures, methods, and/or uses.

For example, a single theoretical distribution that is theoretically derived from the model of the local region having a desired reference amount of the physical parameter and an actually measured distribution of the variable resistance element may be compared, and when the theoretical distribution and the measured distribution match to a predetermined degree, the estimated amount of the physical parameter may be determined to be the reference amount.

Such a determination can be performed without preparing a large number of theoretical distributions, and thus is useful, for example, in the case of judging only whether or not the estimated amount of the physical parameter of the variable resistance element fits the desired estimated amount.

Furthermore, for example, the theoretical distribution need not necessarily be stored in the estimation device in advance, and may be calculated by the estimation device every time when the estimation method is executed or may be provided by a device that is separately provided.

Furthermore, for example, it may be that the estimation device (i) change the resistive status of the local region of the variable resistance element and perform measurement to obtain measurement values each indicating the resistance state after one of the changes made to the resistive status of the local region of the variable resistance element or (ii) change the resistive status of the variable resistance element and perform measurement by driving the inspection device connected to the estimation device or by driving the programming circuit and the read circuit in the nonvolatile memory device. Furthermore, it may be that the estimation device is not involved in the operation of changing and measuring the resistive status of the variable resistance element and executes the estimation method by obtaining measurement values that are acquired by measuring in advance the variable resistance element by a device that is separately provided.

INDUSTRIAL APPLICABILITY

One or more exemplary embodiments disclosed herein are applicable to, as an estimation method and a screening method for a variable resistance element, an estimation device and an inspection device for a variable resistance element, and various products, such as a nonvolatile memory device, that include the variable resistance elements.

The invention claimed is:

1. An estimation method for a variable resistance element including (i) a first electrode, (ii) a second electrode, and therebetween (iii) a variable resistance layer in which a local region is formed which has a resistive status that reversibly changes according to an electric pulse applied between the first electrode and the second electrode, the estimation method comprising:
   obtaining, when changes are made to the resistive status of the local region, measurement values, each indicating a resistance state after one of the changes; and
   determining, based on a distribution of the obtained measurement values, whether an estimated amount of a physical parameter regarding structural characteristics of the local region is a reference amount of the physical parameter regarding structural characteristics of the local region, by a calculation; and
   judging, based on a result of the determining, resistance change characteristics of the variable resistance element, so as to determine if the variable resistance element is defective,
   wherein the physical parameter regarding structural characteristics of the local region includes at least one parameter selected from: a packing density of defects concerning a deficiency of oxygen; a diameter of the local region; and a length of the local region.

2. The estimation method for a variable resistance element according to claim 1,
   wherein in the determining, (i) a theoretical distribution, which is a distribution of resistance states theoretically derived from a model of the local region having the reference amount of the physical parameter regarding structural characteristics of the local region, and (ii) a measured distribution, which is a distribution of the resistance states indicated by the obtained measurement values, are compared, and, when the theoretical distribution and the measured distribution match to a predetermined degree, the estimated amount of the physical parameter regarding structural characteristics of the local region is determined to be the reference amount of the physical parameter regarding structural characteristics of the local region.

3. The estimation method for a variable resistance element according to claim 2,
   wherein in the determining, (i) the theoretical distribution comprises a plurality of theoretical distributions of resistance states and the reference amount comprises different reference amounts of the physical parameter regarding structural characteristics of the local region, each of the plurality of theoretical distributions theoretically derived from the model of the local region for one of the different reference amounts of the physical parameter regarding structural characteristics of the local region, and (ii) the measured distribution are compared, and the estimated amount of the physical parameter regarding structural characteristics of the local region is determined to be one of the different reference amounts of the physical parameter regarding structural characteristics of the local region for which one theoretical distribution of the theoretical distributions that matches with the measured distribution to a highest degree is derived.

4. The estimation method for a variable resistance element according to claim 2,
   wherein the local region comprises a metal oxide,
   the reference amount indicates a dimension and a packing density of defects concerning a deficiency of oxygen, the dimension and the packing density of defects each being the physical parameter regarding structural characteristics of the local region, and
   the model represents a three-dimensional region having a dimension indicated by the reference amount and is divided into a plurality of portions each representing an oxygen site,
   the estimation method further comprising deriving the theoretical distribution,
   the deriving including:
   performing simulations in each of which hopping sites created by deficiency of oxygen are randomly allocated to a number of sites, among sites of the model, which corresponds to the packing density of defects indicated by the reference amount;
   calculating, in each of the simulations, a theoretical resistance value of the variable resistance element as a whole, based on a formation state of a filament, comprising the hopping sites, that extends from a portion closest to the first electrode and a peripheral portion of the first electrode to a portion in contact with the second electrode in the local region; and
   deriving, as the theoretical distribution, a distribution of the calculated resistance values.

5. The estimation method for a variable resistance element according to claim 4,
   wherein in the deriving, the theoretical distribution is derived from the model of the local region for each of different reference amounts of the physical parameter regarding structural characteristics of the local region,
   the estimation method further comprising storing the derived theoretical distributions, and
   in the determining, the estimated amount of the physical parameter regarding structural characteristics of the local region is determined by comparing the theoretical distributions stored in the storing and the measured distribution.

6. The estimation method for a variable resistance element according to claim 1,
   wherein in the determining, (i) a representative value which is an intermediate value of the obtained measurement values and (ii) an amount of variation of the obtained measurement values are calculated, and the estimated amount of the physical parameter regarding structural characteristics of the local region is determined to be an amount obtained by substituting the calculated representative value and the calculated amount of variation into an estimation expression.

7. The estimation method for a variable resistance element according to claim 6,
   wherein the physical parameter regarding structural characteristics of the local region is an area of the local region,
   the estimation expression includes (i) a term in which the representative value is multiplied by the amount of variation or (ii) a term in which a square of the amount of variation is divided by the representative value, and
   in the determining, the estimated amount of the area of the local region is determined by (i) multiplying the representative value by the amount of variation or (ii)

dividing a square of the amount of variation by the representative value, according to the estimation expression.

8. The estimation method for a variable resistance element according to claim 6,
wherein the physical parameter regarding structural characteristics of the local region is a packing density of defects in the local region,
the estimation expression includes a term in which the representative value is divided by the amount of variation, and
in the determining, the estimated amount of the packing density of defects in the local region is determined by dividing the representative value by the amount of variation, according to the estimation expression.

9. The estimation method for a variable resistance element according to claim 6,
wherein in the determining, a mean or a median of the measurement values is calculated as the representative value.

10. The estimation method for a variable resistance element according to claim 1, further comprising:
making the changes to the resistive status of the local region; and
measuring the resistive status of the variable resistance element after each of the changes, to acquire the measurement values,
wherein in the obtaining, the measurement values acquired in the measuring are obtained.

11. The estimation method for a variable resistance element according to claim 1, further comprising
judging whether the variable resistance element is non-defective or defective based on whether or not the estimated amount of the physical parameter regarding structural characteristics of the local region determined in the determining satisfies a predetermined condition.

12. The estimation method for a variable resistance element according to claim 11, further comprising
excluding the variable resistance element from use, when the variable resistance element is judged to be defective in the judging.

13. The estimation method for a variable resistance element according to claim 11, further comprising
modifying the variable resistance element, when the variable resistance element is judged to be defective in the judging.

14. An estimation method for a variable resistance element including (i) a first electrode, (ii) a second electrode, and therebetween (iii) a variable resistance layer in which a local region is formed which has a resistive status that reversibly changes according to an electric pulse applied between the first electrode and the second electrode, the estimation method comprising:
obtaining an estimated amount of a physical parameter regarding structural characteristics of the local region; and
judging whether the variable resistance element is non-defective or defective based on whether or not the obtained estimated amount of the physical parameter regarding structural characteristics of the local region satisfies a predetermined condition with respect to a reference amount of the physical parameter regarding structural characteristics of the local region,
wherein the physical parameter regarding structural characteristics of the local region includes at least one parameter selected from: a packing density of defects concerning a deficiency of oxygen; a diameter of the local region; and a length of the local region.

15. An estimation device which performs estimation of a variable resistance element including (i) a first electrode, (ii) a second electrode, and therebetween (iii) a variable resistance layer in which a local region is formed which has a resistive status that reversibly changes according to an electric pulse applied between the first electrode and the second electrode, the estimation device comprising:
an obtainment unit configured to obtain, when changes are made to the resistive status of the local region, measurement values, each indicating a resistance state after one of the changes; and
a determination unit configured to determine, based on a distribution of the obtained measurement values, whether an estimated amount of a physical parameter regarding structural characteristics of the local region is a reference amount of the physical parameter regarding structural characteristics of the local region, by a calculation; and
a judgment unit configured to judge, based on a result of the determination of the determination unit, resistance change characteristics of the variable resistance element, so as to determine if the variable resistance element is defective,
wherein the physical parameter regarding structural characteristics of the local region includes at least one parameter selected from: a packing density of defects concerning a deficiency of oxygen; a diameter of the local region; and a length of the local region.

16. The estimation device according to claim 15,
wherein the determination unit is configured to compare (i) a theoretical distribution, which is a distribution of resistance states theoretically derived from a model of the local region having the reference amount of the physical parameter regarding structural characteristics of the local region, and (ii) a measured distribution, which is a distribution of the resistance states indicated by the obtained measurement values and, when the theoretical distribution and the measured distribution match to a predetermined degree, determine that the estimated amount of the physical parameter regarding structural characteristics of the local region is the reference amount of the physical parameter regarding structural characteristics of the local region.

17. The estimation device according to claim 16, further comprising
a storage unit configured to store theoretical distributions of resistance states, each theoretically derived from the model of the local region for one of different reference amounts of the physical parameter regarding structural characteristics of the local region,
wherein the determination unit is configured to determine the estimated amount of the physical parameter regarding structural characteristics of the local region by comparing the theoretical distributions stored in the storage unit and the measured distribution.

18. The estimation device according to claim 15,
wherein the determination unit is configured to calculate (i) a representative value which is an intermediate value of the obtained measurement values and (ii) an amount of variation of the obtained measurement values, and determine that the estimated amount of the physical parameter regarding structural characteristics of the local region is an amount obtained by substituting the calculated representative value and the calculated amount of variation into an estimation expression.

19. The estimation device according to claim 15,
wherein the judgment unit is further configured to judge whether the variable resistance element is non-defective or defective based on whether or not the estimated amount of the physical parameter regarding structural characteristics of the local region determined by the determination unit satisfies a predetermined condition.

20. An inspection device for inspecting a variable resistance element including (i) a first electrode, (ii) a second electrode, and therebetween (iii) a variable resistance layer in which a local region is formed which has resistive status that reversibly changes according to an electric pulse applied between the first electrode and the second electrode, the inspection device comprising
the estimation device according to claim 19,
the inspection device judging, using the estimation device, whether the variable resistance element is non-defective or defective, and excluding the variable resistance element from use when the variable resistance element is judged to be defective.

21. An inspection device for inspecting a variable resistance element including (i) a first electrode, (ii) a second electrode, and therebetween (iii) a variable resistance layer in which a local region is formed which has resistive status that reversibly changes according to an electric pulse applied between the first electrode and the second electrode, the inspection device comprising
the estimation device according to claim 19,
the inspection device judging, using the estimation device, whether the variable resistance element is non-defective or defective, and modifying the variable resistance element when the variable resistance element is judged to be defective.

22. A nonvolatile memory device comprising:
a variable resistance element including (i) a first electrode, (ii) a second electrode, and therebetween (iii) a variable resistance layer in which a local region is formed which has a resistive status that reversibly changes according to an electric pulse applied between the first electrode and the second electrode;
a programming circuit which applies an electric pulse to the variable resistance element for changing the resistive status of the local region;
a read circuit which obtains a measurement value indicating a resistance state of the variable resistance element; and
an inspection circuit which (i) makes changes to the resistive status of the local region by using the programming circuit, (ii) obtains measurement values each indicating a resistance state after one of the changes by using the read circuit, (iii) determines, based on a distribution of the obtained measurement values, an estimated amount of a physical parameter regarding structural characteristics of the local region, by a calculation, and (iv) judges, based on a result of the determination, resistance change characteristics of the variable resistance element, so as to determine if the variable resistance element is defective,
wherein the physical parameter regarding structural characteristics of the local region includes at least one parameter selected from: a packing density of defects concerning a deficiency of oxygen; a diameter of the local region; and a length of the local region.

23. The nonvolatile memory device according to claim 22, further comprising
a redundant variable resistance element having a structure identical with a structure of the variable resistance element,
wherein the inspection circuit judges whether the variable resistance element is non-defective or defective based on whether or not the determined estimated amount of the physical parameter regarding structural characteristics of the local region satisfies a predetermined condition, and replaces the variable resistance element with the redundant variable resistance element when the variable resistance element is judged to be defective.

24. The nonvolatile memory device according to claim 22,
wherein the inspection circuit judges whether the variable resistance element is non-defective or defective based on whether or not the determined estimated amount of the physical parameter regarding structural characteristics of the local region satisfies a predetermined condition, and performs an initial breakdown of the variable resistance element by using the programming circuit when the variable resistance element is judged to be defective.

* * * * *